(12) United States Patent
Jeong et al.

(10) Patent No.: US 10,560,123 B2
(45) Date of Patent: Feb. 11, 2020

(54) METHOD FOR GENERATING A SEQUENCE FOR A POLA CODE AND MEDIUM THEREFOR AND METHOD AND APPARATUS FOR TRANSMITTING DATA USING THEREOF

(71) Applicants: Samsung Electronics Co., Ltd., Suwon-si, Gyeonggi-do (KR); SUNGKYUNKWAN UNIVERSITY RESEARCH & BUSINESS FOUNDATION, Suwon-si, Gyeonggi-do (KR)

(72) Inventors: Hongsil Jeong, Suwon-si (KR); Sanghyo Kim, Seongnam-si (KR); Jonghwan Kim, Suwon-si (KR); Yeonjoon Choi, Suwon-si (KR); Kyungjoong Kim, Suwon-si (KR); Jaeyoel Kim, Seongnam-si (KR); Seho Myung, Seoul (KR); Min Jang, Seongnam-si (KR)

(73) Assignees: Samsung Electronics Co., Ltd., Suwon-si (KR); Sungkyunkwan University Research & Business Foundation, Suwon-si (KR)

( * ) Notice: Subject to any disclaimer, the term of this patent is extended or adjusted under 35 U.S.C. 154(b) by 55 days.

(21) Appl. No.: 15/934,575

(22) Filed: Mar. 23, 2018

(65) Prior Publication Data
US 2018/0278268 A1    Sep. 27, 2018

(30) Foreign Application Priority Data

Mar. 23, 2017 (KR) .......................... 10-2017-0037229
Jul. 14, 2017 (KR) .......................... 10-2017-0089916
(Continued)

(51) Int. Cl.
*H03M 13/13* (2006.01)
*H04L 1/00* (2006.01)
*H03M 13/00* (2006.01)

(52) U.S. Cl.
CPC ......... *H03M 13/13* (2013.01); *H03M 13/617* (2013.01); *H03M 13/6516* (2013.01);
(Continued)

(58) Field of Classification Search
CPC ............. H03M 13/13; H03M 13/6516; H03M 13/617; H04L 1/0041; H04L 1/0057; H04L 1/0043
(Continued)

(56) References Cited

U.S. PATENT DOCUMENTS

| 8,347,186 B1 | 1/2013 | Arikan |
| 2017/0077954 A1* | 3/2017 | Shen ..................... H03M 13/13 |

(Continued)

OTHER PUBLICATIONS

Huawei, et al., "Polar code design and rate matching," R1-167209, 3GPP TSG RAN WG1 Meeting #86, Gothenburg, Sweden, Aug. 22-26, 2016, 14 pages.
(Continued)

*Primary Examiner* — James C Kerveros

(57) ABSTRACT

The present disclosure relates to a method and an apparatus for coding data to be transmitted in a communication system, and more particularly, to a method and an apparatus for generating a sequence for a polar code for use in a communication system and a method and an apparatus for transmitting data using the same. The method according to the embodiment of the present disclosure is a method for transmitting data using a polar code including: generating a single polar code sequence for transmitting the data; coding the data using the generated single polar code sequence; and transmitting the polar-coded data.

19 Claims, 13 Drawing Sheets

(30) Foreign Application Priority Data

Jul. 21, 2017 (KR) .......................... 10-2017-0092654
Jul. 25, 2017 (KR) .......................... 10-2017-0094443
Jul. 26, 2017 (KR) .......................... 10-2017-0094779

(52) U.S. Cl.
CPC .......... *H04L 1/0041* (2013.01); *H04L 1/0043* (2013.01); *H04L 1/0057* (2013.01)

(58) Field of Classification Search
USPC ........................................................ 714/755
See application file for complete search history.

(56) References Cited

U.S. PATENT DOCUMENTS

2017/0111060 A1* 4/2017 Huang .................. H03M 13/13
2019/0199474 A1* 6/2019 Chen ..................... H04L 1/0057

OTHER PUBLICATIONS

Huawei, et al., "Details of the Polar code design," R1-1611254, 3GPP TSG RAN WG1 Meeting #87, Reno, USA, Nov. 10-14, 2016, 15 pages.

* cited by examiner

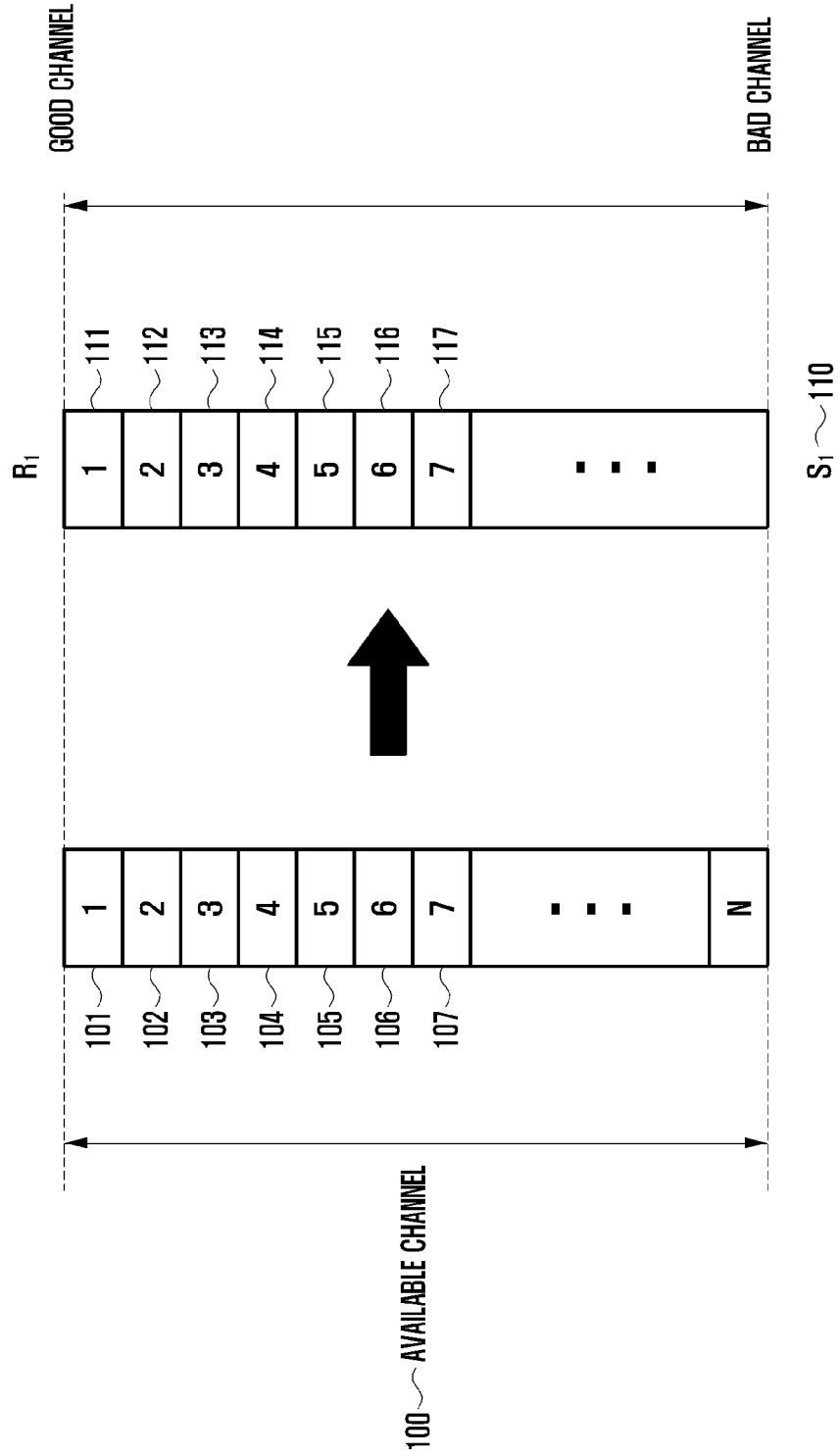

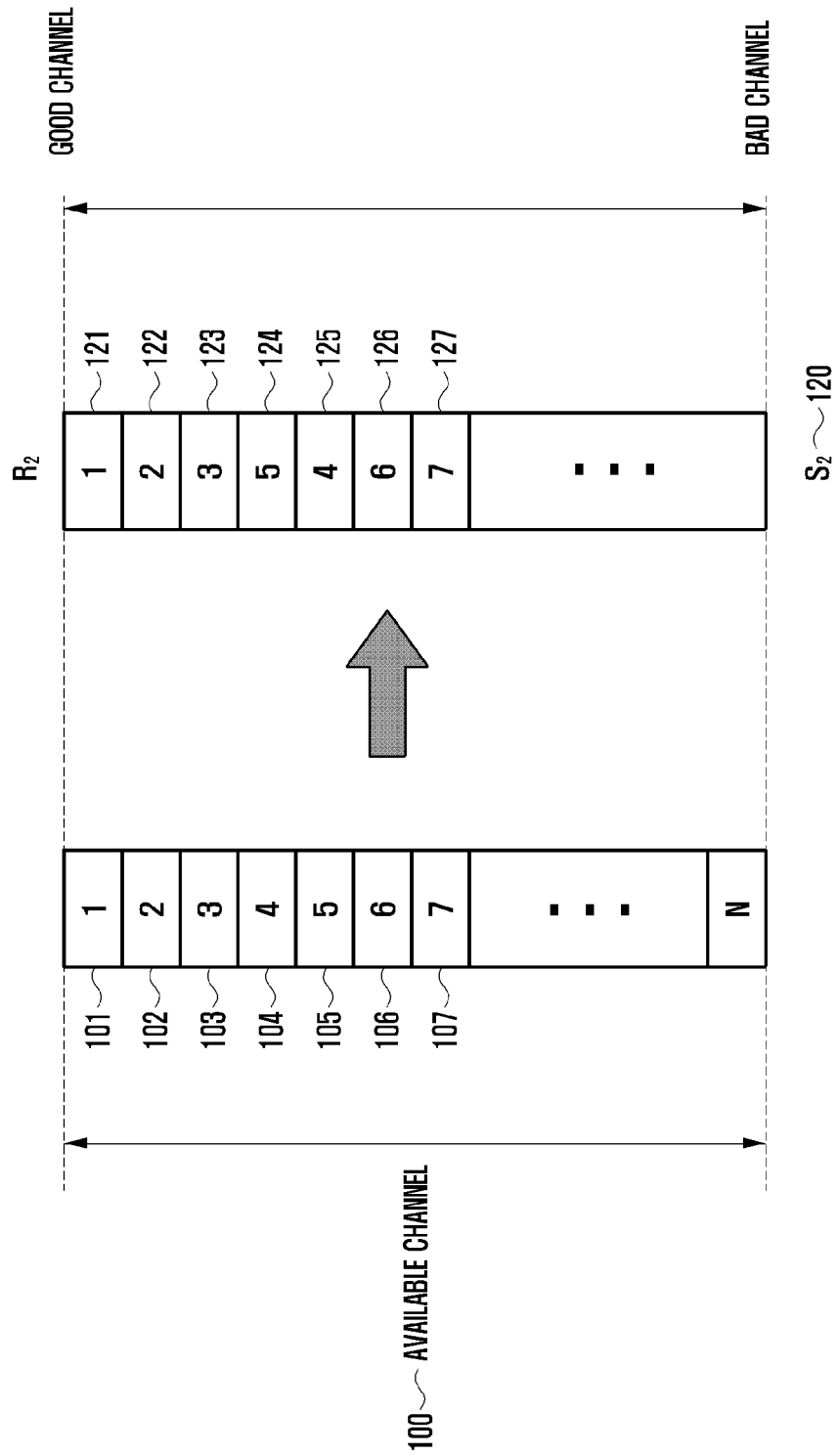

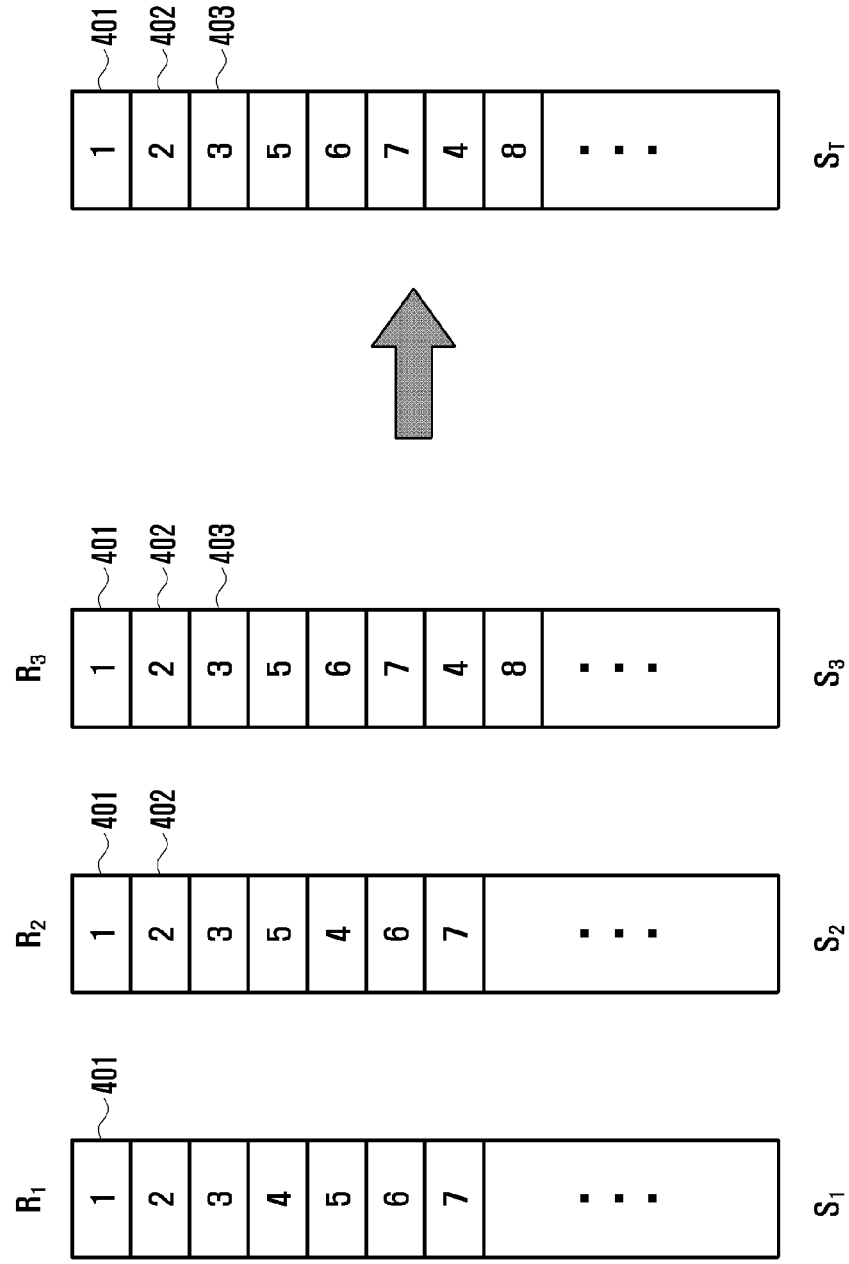

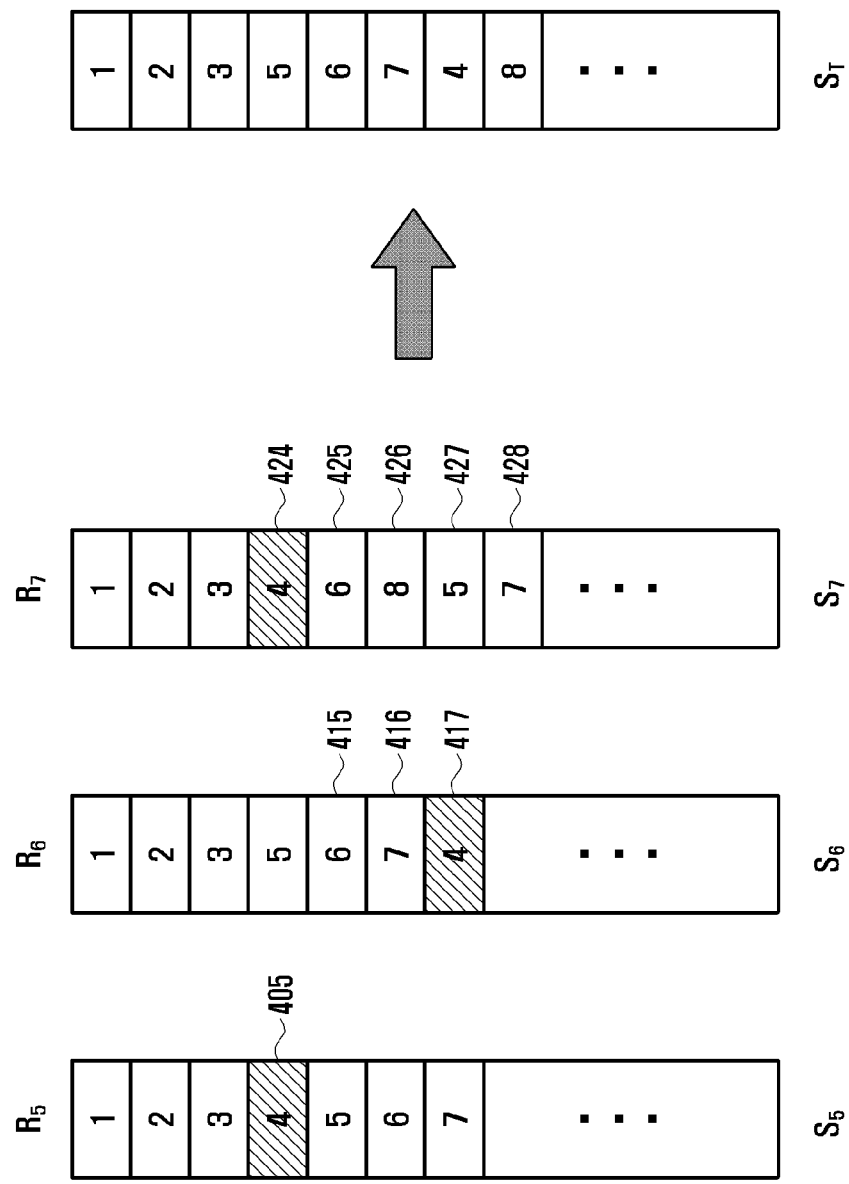

METHOD FOR GENERATING A SEQUENCE FOR A POLA CODE AND MEDIUM THEREFOR AND METHOD AND APPARATUS FOR TRANSMITTING DATA USING THEREOF

CROSS-REFERENCE TO RELATED APPLICATIONS AND CLAIM OF PRIORITY

This application is based on and claims priority under 35 U.S.C. § 119 to Korean Patent Application No. 10-2017-0037229, filed on Mar. 23, 2017, No. 10-2017-0089916 filed on Jul. 14, 2017, No. 10-2017-0092654 filed on Jul. 21, 2017, No. 10-2017-0094443 filed on Jul. 25, 2017, and No. 10-2017-0094779 filed on Jul. 26, 2017, in the Korean Intellectual Property Office, the disclosure of which is incorporated by reference herein in its entirety.

TECHNICAL FIELD

Various embodiments of the present disclosure relate to a method and an apparatus for coding data to be transmitted in a communication system, and more particularly, to a method and an apparatus for generating a sequence for a polar code for use in a communication system and a method and an apparatus for transmitting data using the same.

BACKGROUND

In general, data errors may occur due to noise existing in the communication channel. As described above, there is an error correction coding scheme as a coding scheme designed for a receiver to correct an error occurring by a communication channel. These error correction codes are also referred to as channel coding. The error correction coding technique is a technique of transmitting redundant bits to data to be transmitted and transmitting the data.

There are various error correction coding techniques. For example, there are convolutional coding, turbo coding, LDPC coding, and polar coding schemes or the like. Among these error correction coding schemes, the polar code scheme is a first code which is theoretically proven to achieve point-to-point channel capacity using channel polarization. The polar code can be designed as a code optimized for each channel or code rate by density evolution, reciprocal channel approximation (RCA), and the like. However, in order to apply the polar coding scheme in the actual communication system, it is necessary to have an optimized index sequence at each code rate in advance. As such, generating the index sequence in advance has a problem of increasing memory complexity.

On the other hand, the 5th generation (5G) mobile communication technology, which has recently been proposed as a next generation mobile communication system, mainly mentions the following three scenarios. The three scenarios are enhanced mobile broadband (eMBB), ultra-reliable and low latency communication (URLLC), and massive machine type communication (mMTC). As described above, the error correction codes for supporting various schemes may support various code rates with stable performance.

However, there has not yet been a method for preventing the increase in the memory complexity while satisfying all of these various methods.

SUMMARY

Accordingly, embodiments of the present disclosure are directed to the provision of a method for designing a polar code for supporting various scenarios of an actual 5G mobile communication technology by designing a polar code supporting various code rates with a performance optimized for each channel by a single index sequence and an apparatus and a method for transmitting data using the same.

Another object of the present disclosure is directed to the provision of an apparatus and a method for transmitting data using a method for designing a polar code capable of having high performance even at various code rates and reducing complexity, and an apparatus for transmitting data using the designed method.

Still another object of the present disclosure is directed to the provision of a method for designing a single index sequence capable of supporting code rate compatibility with small performance degradation in practical application of a polar code, and an apparatus and a method for transmitting data using the same.

Objects of the present disclosure are not limited to the above-mentioned objects. That is, other objects that are not mentioned may be obviously understood by those skilled in the art to which the present disclosure pertains from the following description.

Various embodiments of the present disclosure are directed to the provision of a method for transmitting data using a polar code, including: generating a single polar code sequence for transmitting the data; coding the data using the generated single polar code sequence; and transmitting the polar-coded data, wherein the generation of the single polar code sequence includes: calculating an error rate by a method previously established for each polarized sub-channel available in a communication system corresponding to each code rate; aligning the polarized sub-channels in order from a channel having a low error rate to a polarized sub-channel having a high error rate based on the error rate of the available polarized sub-channels for each code rate; generating channel index sequences assigning an index to the polarized sub-channels aligned for each code rate; and generating the single polar code sequence having a desired size using the channel index sequence generated for each code rate, and wherein in the single polar code sequence, a channel index sequence having a lowest code rate among the each code rates is sequentially inserted into the single polar code sequence, when the remaining region is present in the single polar code sequence, a channel index sequence having the lowest code rate among the remaining code rates other than the inserted code rates is selected, and subsequent channel index sequences other than the same channel index sequence number as the previously inserted sequence in the selected channel index sequence are sequentially aligned.

An apparatus for transmitting data using a polar code, comprising: a memory configured to store at least one single polar code sequence (s); a polar coder configured to polar-code data to be transmitted using a single polar code sequence; a transceiver configured to transmit the polar-coded data; a processor configured to determine one of the single polar cod sequences based on a length of data to be transmitted, a target error rate, and a code rate.

Various embodiments of the present disclosure are directed to the provision of a method for transmitting data using a polar code including: generating a single polar code sequence for transmitting the data; coding the data using the generated single polar code sequence; and transmitting the polar-coded data, wherein the generation of the single polar code sequence includes: calculating an error rate by a method previously established for each polarized sub-channel available in a communication system corresponding to each code rate; aligning the polarized sub-channels in order from a channel having a low error rate to a polarized sub-channel having a high error rate based on the error rate of the available polarized sub-channels for each code rate; calculating a penalty $W_j$ indicating a degradation in code performance from the channel index sequence having a lowest code rate among the respective channel index sequences by a predetermined method; realigning the channel index sequences having the lowest code rate based on the penalty; inserting the realigned channel index sequences into the single polar code sequence; a first step of selecting a channel index sequence having the lowest code rate among the remaining code rates other than the inserted code rate; and a second step of realigning the remaining channel indexes other than the aligned channel index in the selected channel sequence by calculating the penalty $W_j$ and then sequentially aligning the remaining realigned channel indexes after the previously aligned channel indexes in the region remaining in the single polar code sequence.

Various embodiments of the present disclosure are directed to the provision of an apparatus for transmitting data using a polar code using the method, including: a memory configured to store at least one single polar code sequence(s); a polar coder configured to polar-code data to be transmitted using a single polar code sequence; a transceiver configured to transmit the polar-coded data; a processor configured to determine one of the single polar cod sequences based on a length of data to be transmitted, a target error rate, and a code rate.

According to the present disclosure, it is possible to support various scenarios of an actual 5G mobile communication technology by designing the polar code for supporting various code rates with the performance optimized for each channel by the single index sequence. In addition, it is possible to have the high performance at various code rates and reduce the complexity.

The effects that may be achieved by the embodiments of the present disclosure are not limited to the above-mentioned objects. That is, other effects that are not mentioned may be obviously understood by those skilled in the art to which the present disclosure pertains from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 1A to 1C illustrate conceptual diagrams illustrating a process of designing an optimized sequence at a specific code rate for explaining the present disclosure.

FIGS. 4A and 4B illustrate conceptually exemplified diagrams for explaining a method for designing a code according to an embodiment of the present disclosure.

DETAILED DESCRIPTION

Figure 1C:
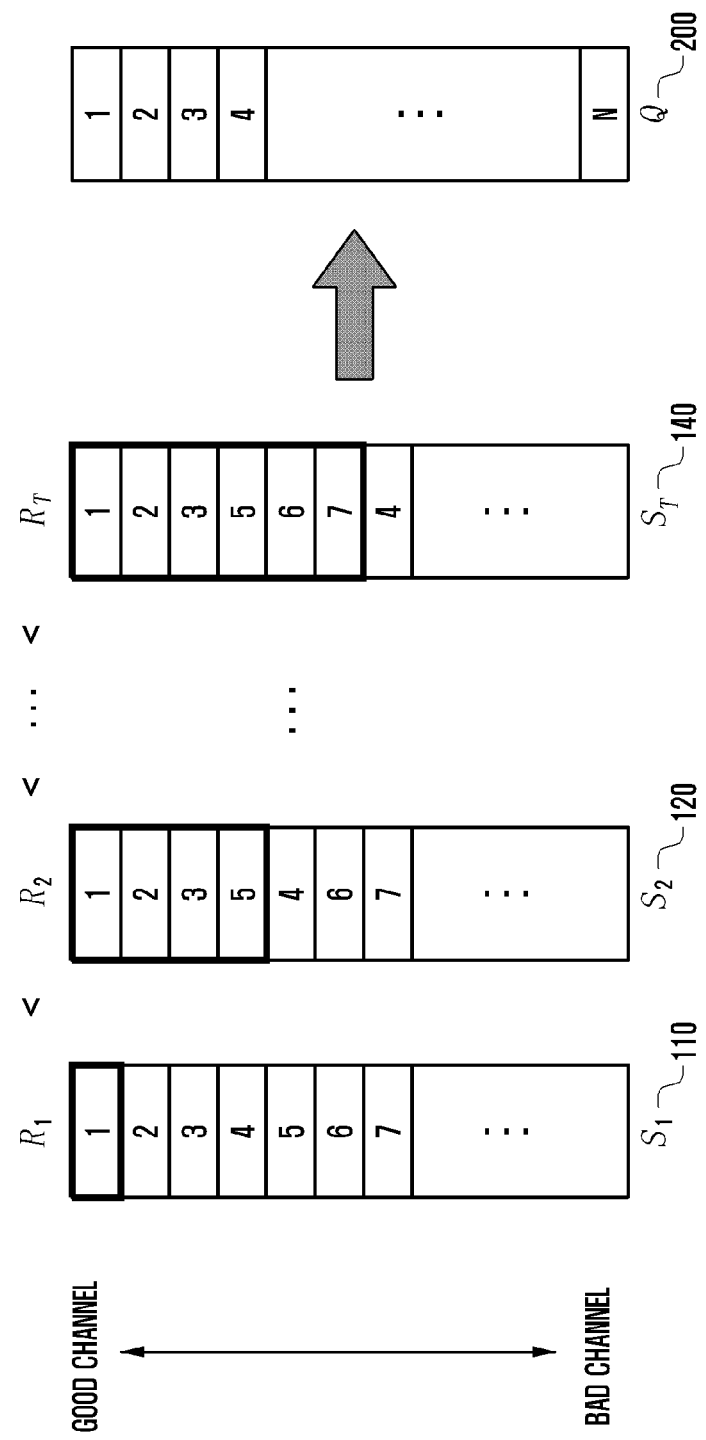

FIGS. 1 through 9B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the present disclosure will be described in detail with reference to the accompanying drawings. At this time, it is noted that like reference numerals denote like elements in appreciating the drawings. Further, the accompanying drawings of the present disclosure are provided to help understanding of the present disclosure and therefore it is to be noted that the present disclosure is not limited to forms, dislocations, etc., illustrated in the drawings of the present disclosure. Further, detailed descriptions related to well-known functions or configurations will be ruled out in order not to unnecessarily obscure the subject matter of the present disclosure. It is to be noted that only parts necessary to understand operations according to embodiments of the present disclosure will be described below and the description of other parts will be omitted so as not to unnecessarily obscure the subject matter of the present disclosure.

Prior to explaining the present disclosure, he known polarity coding schemes will be described in more detail.

First of all, it is important to design a single index sequence capable of supporting code rate compatibility with small performance degradation for various channels, that is, various code rates in practical application of a polar code. Currently, there is a known method for generating an optimized index sequence through a density evolution method for various code rates using the polar coding scheme. In order to use the density evolution method, an optimized design considering each channel environment is required in order to obtain the best performance in each channel.

As one of the methods to solve the code rate compatibility problem, there is a method for designing a code that does not use the existing density evolution method. The method for designing a code that does not use the density evolution method is performed by a method for evaluating reliability of each channel by using a simple polynomial using a binary representation of an index, instead of measuring channel reliability by the density evolution method at the time of selecting a channel index transmitting information bits. For expressing it by a mathematical expression, when each channel index is represented by $i \triangleq B_{n-1}B_{n-2} \ldots B_0$, $B_j \in \{0, 1\}$, and '$B_i=0$' means degradation of the channel during the polarization of the channel, and '$B_i=1$' means upgradation of the channel. Therefore, the reliability of each channel index having such a condition can be calculated by the following Equation 1.

$$W_i = \sum_{j=0}^{n-1} B_j \cdot 2^{\frac{j}{4}}$$

Equation 1

For example, when the reliability of index i=7 (0111) at a code length of n=4 is measured, the reliability is calculated by the following Equation 2.

$$W_7 = 1*2^{(0*\frac{1}{4})} + 1*2^{(1*\frac{1}{4})} + 1*2^{(2*\frac{1}{4})} + 0*2^{(3*\frac{1}{4})} = 3.6034$$

Equation 2

The reliability of each channel can be calculated based on the simple polynomial as in the above Equation 2, and the reliability $W_0^{N-1}$ of each channel is sorted in ascending order. At this time, if the reliability of each channel is defined as $W_{Q_0} \leq W_{Q_1} \leq W_{Q_2} \leq \ldots W_{Q_N}$, the result arranged in the ascending order is as $[W_{Q_0}, W_{Q_1}, W_{Q_2}, \ldots W_{Q_N}]$. In such arranged sequences, the index sequence $Q_0^{N-1}$ is the single index sequence for the code design.

On the other hand, as described above, storing and using each optimized index sequence to support various code rates in various scenarios of the 5G (5G) mobile communication technology are inefficient in terms of memory complexity. In order to solve the problem of the polar code, there is a technique of expressing and measuring reliabilities of each channel by a simple polynomial using the method for designing a polar code already proposed and aligning the measured reliability to generate the single index sequence. However, the code designed using a simple polynomial is not optimized for each channel, so the best performance cannot be obtained at each code rate. Therefore, the scheme for using a simple polynomial can design the polar sign with various code rates without serious performance degradation, but there is a definite limitation in designing a code having the best performance in each channel.

Therefore, the present disclosure described below will describe a method for designing a single index sequence for obtaining the best performance at each code rate based on the optimized index sequence using the density evolution at each code rate and an apparatus and a method for using a coding scheme designed by the method for designing a single index sequence.

The important point of the present disclosure is that the optimized information set at each code rate is included in the single index sequence by using the inclusion relation of the information set having a subset of the information bits of the optimized code in each channel to demonstrate the best performance even when the single sequence is used at various code rates.

FIGS. 1A to 1C illustrate conceptual diagrams illustrating a process of designing an optimized sequence at a specific code rate for explaining the present disclosure.

First, referring to FIG. 1A, indexes may be allocated to each of all channels, available in a corresponding communication system for a specific code rate $R_1$. For example, if it is assumed that the number of available channels 100 is N and one index is allocated to each channel, N indexes such as 1, 2, 3, 4, 5, 6, 7, . . . , and N may be given. The available channel 1 is denoted by reference numeral 101, the available channel 2 is denoted by reference numeral 102, the available channel 3 is denoted by reference numeral 103, the available channel 4 is denoted by reference numeral 104, the available channel 5 is denoted by reference numeral 105, the available channel 6 is denoted by reference numeral 106, and the available channel 7 is denoted by reference numeral 107.

At this time, error rates for each channel may be calculated using the density evolution technique or another optimization method at the specific code rate $R_1$. It is possible to generate an optimized bit channel index sequence by aligning the channel indexes in descending order from a good channel to a bad channel depending on the channel state using the error rates calculated for each channel at the set code rate $R_1$. The example of FIG. 1A illustrates the case in which the good channels and the bad channels have a series of bit channel index sequences in the same order as the order of indexes of the available channel indexes 100. However, it is apparent to those skilled in the art that in actual situations, the channel indexes available in a form different from that illustrated in FIG. 1A can be arranged in order from the good channel to the bad channel. For example, in an actual situation, a bit channel index sequence arranged in order from a good channel to a bad channel for each channel at a specific code rate $R_1$, may be determined like "6, m−5, 3, m+2, 4, N, 2, . . . ". Here, m is an integer larger than 1 and smaller than N.

Herein, the meaning used in the present specification for the good channel and the bad channel will be described. The meaning of the good channel performance of the bits in the polar code is that a quality of a polarized sub-channel experienced by each bit after channel polarization of a polar code is superior and a bit error rate of the corresponding bit is low. In addition, in this specification, indexes of each bit of the polar code and each bit of the sequence are referred to as a channel. These channels all refer to the polarized sub-channel of the polar code. Therefore, the channel (channel through which an actual signal is transmitted) referred to in this specification may have a different meaning from a generally used physical channel. When encoded/decoded by the polar code, each bit has different channel capacities. Therefore, in the following description, bits having high capacity are called a good polarized sub-channel or a good channel, and bits with low capacity are referred to as a bad polarized sub-channel or a bad channel.

In addition, in the example of FIG. 1A, for each of the bit channel indexes in the order of the good channel to the bad channel for each channel at the specific code rate $R_1$, the available channel 1, which is the best channel, is denoted by reference numeral 111, the available channel 2, which is the second best channel, is denoted by reference numeral 112, the available channel 3, which is the third best channel, is denoted by reference numeral 113, the available channel 4, which is the fourth best channel, is denoted by reference numeral 114, the available channel 5, which is the fifth best channel, is denoted by reference numeral 115, the available channel 6, which is the sixth best channel, is denoted by reference numeral 116, and the available channel 7, which is the seventh best channel, is denoted by reference numeral 117. In the following description, the optimized bit channel index sequence in which the channel indexes are aligned in descending order from the good channel to the bad channel depending on the channel state using the error rates calculated for each channel at the specific code rate $R_1$ is called $S_1$ 110.

In addition, in FIG. 1A, changing reference numbers for each channel index at the code rates is to explain how to change the channel index numbers depending on each code rate.

Next, an optimized bit channel index sequence $S_2$ 120 in which channel indexes are arranged in descending order from a good channel to a bad channel depending on the channel state using the error rate calculated for each channel at another specific code rate $R_2$ may be described with reference to FIG. 1B.

Referring to FIG. 1B in comparison with FIG. 1A, it can be seen that the code rate is changed from $R_1$ to $R_2$, and that the optimized bit channel index sequence is changed from $S_1$ to the optimized bit channel index sequence $S_2$. Also, it can be recognized that the order of the optimized bit channel index $S_1$ and the channel index at the code rate $R_1$ is changed in the bit channel index sequence $S_2$ optimized at the code rate $R_2$. That is, at the code rate $R_2$, the channel index 1 121 which is the best channel, the channel index 2 122 which is the second best channel, and the third best index 3 123 have the same order at the code rate $R_1$ and at the code rate $R_2$. On the other hand, the fourth best channel index 5 124 at the code rate $R_2$ has an index different from the fourth best channel index 4 114 at the code rate $R_1$. In addition, the fifth best channel index 4 125 at the code rate $R_2$ has an index different from the fifth best channel index 5 115 at the code rate $R_1$.

FIGS. 1A and 1B are diagrams for explaining that optimized channel indexes at the respective code rates may be the same or different. As a result, if the code rate is changed, it means that the optimized bit channel index sequence may be changed.

Accordingly, if T code rates are used in a particular communication system, as illustrated in FIG. 1C, the optimized bit channel index sequence $S_1$ 110 at the code rate $R_1$ may be computed, and the optimized bit channel index sequence $S_2$ 120 at the code rate $R_2$ may be calculated, and the optimized bit channel index sequence $S_T$ 140 at the code rate $R_T$ may be calculated.

In this way, in the present disclosure, the optimized bit channel index sequences $S_1$ 110, $S_2$ 120, . . . , $S_T$ 140 at each code rate may be used to obtain a bit channel index sequence which is to be applied to the final polar code scheme available at all code rates.

In the present disclosure, an optimized final bit channel index sequence Q200 which is actually used is generated by using the optimized bit channel index sequences "{$S_1$, $S_2$, . . . , $S_T$} at T code rates "{$R_1$, $R_2$, . . . , $R_T$}" used in the communication system. Here, the code rate $R_i$=$k_i$/N, in which ki means the number of channels used for the data transmission among N bit channels. Since channels with low error rates are used for the data transmission at each code rate, data channels are sequentially arranged from the top channel index of each sequence.

As illustrated in FIG. 1A, one data channel is selected when "$k_1$=1" for the code rate $R_1$ and as illustrated in FIG. 1B, four data channels are selected when "$k_2$=4" for the code rate $R_2$. In the following description, a set of channel indexes selected by the data channel as above is referred to as an "information set", and the information set for each code rate is denoted by $A_i$. Each of the information sets at each code rate selected according to the scheme of FIGS. 1A and 1B is $A_1$={1} and $A_2$={1, 2, 3, 5}.

Hereinafter, how to design the optimized final bit channel index sequence Q200 to be finally designed using the T sequences described above will be described.

As described above, it is assumed that the optimum sequences at each code rate {$R_1$, $R_2$, . . . , $R_T$} are designed. Prior to describing the method for designing a code, the characteristics of a sequence designed by the method for designing a code of the present disclosure may be described by being divided into two cases The first case is that {$R_1$, $R_2$, . . . , $R_T$} is set appropriately and the inclusion relation of $A_1 \subset A_2 \subset \ldots \subset A_T$ is established. This may be described with reference to FIG. 2.

Figure 2:
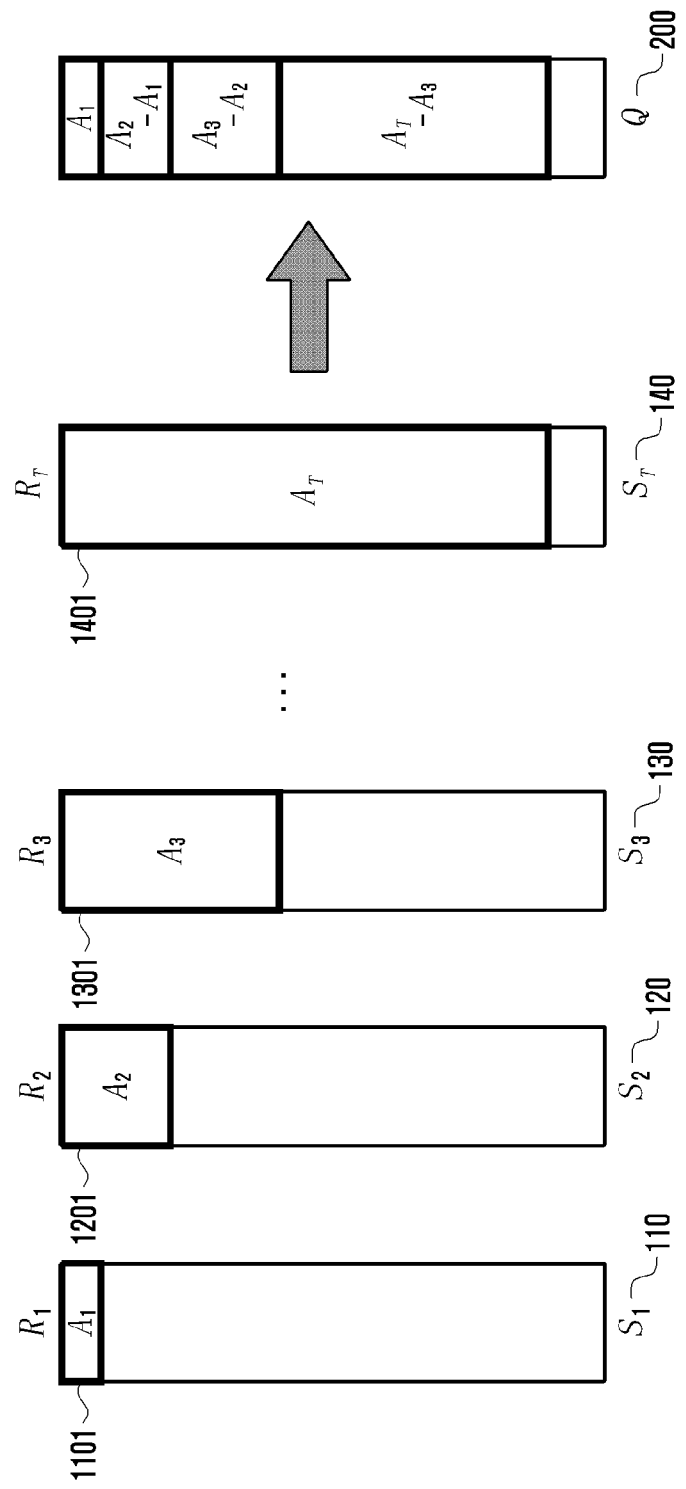
FIG. 2 illustrates a conceptual diagram for explaining a method for designing a single polar code sequence according to an embodiment of the present disclosure.

FIG. 2 illustrates a conceptual diagram for explaining a method for designing a single polar code sequence according to an embodiment of the present disclosure.

Referring to FIG. 2, if the optimized bit channel index sequence $S_1$ 110 at the code rate $R_1$ is designed, the information set $A_1$ at the code rate $R_1$ is 1110, if the optimized bit channel index sequence $S_2$ 120 at the code rate $R_2$ is designed, the information set $A_2$ at the code rate $R_2$ is 1201, and if the optimized bit channel index sequence $S_3$ 130 at the code rate $R_3$ is designed, the information set $A_3$ at the code rate $R_3$ is 1301, and if the optimized bit channel index sequence $S_T$ 140 at the code rate $R_T$ is designed, the information set $A_T$ at the code rate $R_T$ is 1401.

At this time, when the T value is made smaller, that is, when the code rate interval in which each sequence is designed is large, the inclusion relation between the information sets can be established as described above. In such a case, the sequence may be designed in a form in which the information set enters the optimized final bit channel index sequence Q200 in order of $A_1$, $A_2$-$A_1$, $A_3$-$A_2$, ... as shown in FIG. 2. The indexes of $A_1$ are mapped to the optimized final bit channel index sequence Q200 according to the order of $S_1$, and the indexes of $A_2 \backslash A_1$ (at this time, A2\A1 is $\mathcal{A}_2 \cap \mathcal{A}_1^C$) are mapped to the optimized final bit channel index sequence Q200 according to the order of $S_2$. If the code rate to be supported through the optimized final bit channel index sequence Q200 is only $\{R_1, R_2, \ldots, R_T\}$, the order of the indexes in the respective sets of $A_1$, $A_2$-$A_1$, $A_3$-$A_2$, ... has no effect on error rate performance. Similarly, the sequence order for the code rate smaller than $R_1$ and the code rate larger than $R_T$ may be arbitrarily changed. However, if the code rate other than $\{R_1, R_2, \ldots, R_T\}$ is supported, the error rate performance is changed according to the order of the indexes of the code rates $A_1$, $A_2$-$A_1$, $A_3$-$A_2$, ....

Therefore, in order to design the final bit channel index sequence Q200 optimized for a larger code rate, the optimized final bit channel index sequence Q200 may be designed by increasing the T value. If the T value is increased as described above, there is a high possibility that the inclusion relation between the information sets is not established. Therefore, the second case is the case where the inclusion relation of the above-mentioned information set is not established. In this case, the finally optimized final bit channel index sequence Q200 is generated in consideration of the effect of each channel index on the coding performance of all the code rates (or partial code rates). Specifically, the effect of each index on the coding performance of each code rate may be referred to as "penalty" below.

Prior to describing the method for designing a code according to the second method of the present disclosure, the penalty $W_j$ for the bit index j can be defined by the following Equation 3.

$$W_j = \Sigma_i \alpha_i \{P_i(E_j) - P_i(E_{worst})\}^+ \qquad \text{Equation 3}$$

In the above Equation 3, $P_i(E_j)$ is the error rate of the index j in the sequence $S_i$, $P_i(E_{worst})$ has the lowest error value for indexes belonging to an intersection of the set of indexes not included in the currently optimized final bit channel index sequence Q200 and the $A_i$ set. $\alpha_i$ is a parameter reflecting the importance according to the code rate. For example, if all the code rates have the same importance, all the values of $\alpha_i$ are the same, and $\alpha_i < \alpha_i$ when the code rate i is more important than the code rate i'.

In the above Equation 3, an operation of "$\{\cdot\}^+$" is an operator that outputs a value in $\{\ \}$ as it is if the value in $\{\ \}$ is positive and outputs the value in $\{\ \}$ as 0 if the value in $\{\ \}$ is negative. That is, in the above Equation 3, $\alpha_i \{P_i(E_j) - P_i(E_{worst})\}^+$ indicates a performance loss of the bit index j on the code of the code rate $R_i$, and means that the bit index j always has a value of 0 or greater, and the larger the value, the larger the performance degradation. Therefore, the penalty $W_j$ is a parameter indicating the performance loss of the bit index j on the code of all code rates. However, there may be various methods of defining the penalty. For example, the operation ore the like that takes only a maximum value instead of a sum may be used. For example, it can be represented by the following Equation 4.

$$(W_j = \max\ \{P_i(E_j) - P_i(E_{worst})\} \qquad \text{Equation 4}$$

When a polar code sequence for T code rates is defined, the finally optimized final bit channel index sequence Q200 may be designed by performing the following operations T times based on the equation for the penalty defined above.

Figure 3:
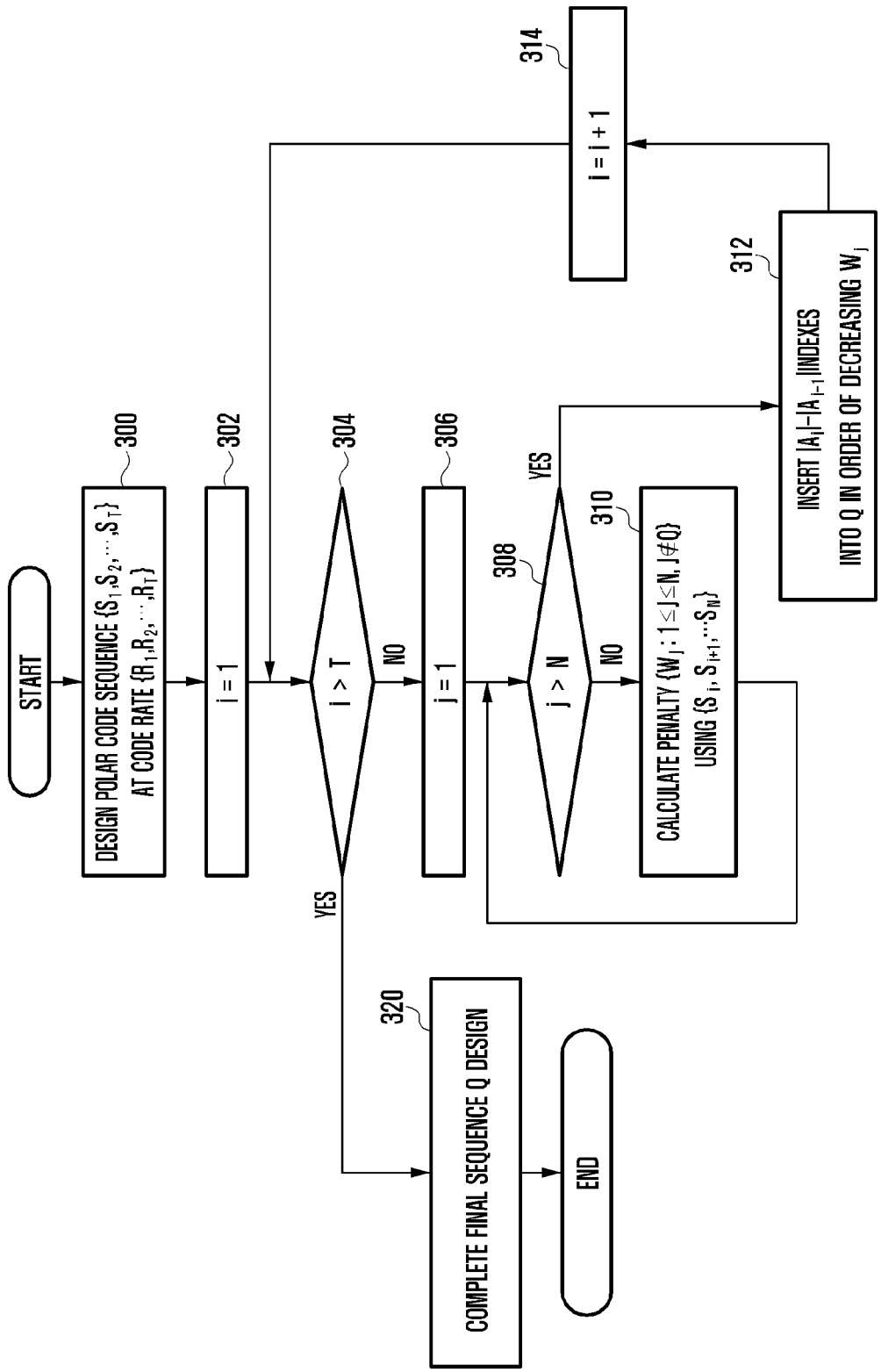
FIG. 3 illustrates a flow chart of a case of generating the single polar code sequence according to the embodiment of the present disclosure.

FIG. 3 illustrates a flow chart of a case of generating the single polar code sequence according to the embodiment of the present disclosure.

In step 300, the value of L is set to be 1. Next, the process proceeds to step 302 it is checked whether the L value is larger than a predetermined M value. In this case, M is the number of code lengths to be considered, for example, when the single sequence for N=$2^5$, $2^6$, ..., $2^{10}$ is designed, M=6. In this case, L is an index of each length. In the above example, N=$2^5$ has a length index of L=1 and N=$2^6$ has a length index of L=2. Therefore, if the initial L is set to be 1, the L value is smaller than the M value. Therefore, the process proceeds to step 304. Thereafter, in step 304, the optimized bit channel index sequences $\{S_1, S_2, \ldots, S_T\}$ at each code rate, that is, $R_1, R_2, \ldots, R_T$ at the code length of index L. Next, in step 306, the process proceeds to step 306, so that the i value is set to be 1, and the process proceeds to step 308, it is determined whether the i value is greater than T. The fact that the i value is greater than T means that the processing of the polar code sequences for all the code rates has been completed. Therefore, the i value may be greater than 1 and less than or equal to T.

In addition, when the process proceeds from step 308 to step 312, the processing of the polar code sequences for all the code rates may be completed. Accordingly, if it is determined as the check result of the step 308 that the processing of the polar code sequences for all the code rates is not completed, the process proceeds to step 306.

In step 306, the j value is set to be 1, and in step 308, it is determined whether the j value is greater than the N value. Here, N may be the set code length. If it is determined as the check result of the step 308 that j is not greater than N, the process proceeds to the step 310, so that the penalty may be calculated using the Equation 3 or Equation 4 or the same concept as described above. That is, the penalty $W_j$ may be calculated at $S_i$. The operation of step 310 may be performed by the code length. Next, step 310 is performed for all code lengths, and then the process may proceed to step 312. In step 312, the polar code sequence may be mapped to the final bit channel index sequence Q200 optimized based on the calculated $W_j$ and inserted thereinto. In this case, according to the method for mapping and inserting into the optimized final bit channel index sequence Q200, as described with reference to FIG. 2, when i>1, it may be selected by $|A_i|-|A_{i-1}|$ and may be sequentially be inserted into the optimized bit channel index sequence Q200. Next, the i value is again increased by 1, and then the process may proceed to step 320.

As described above, if all the processes of T times are completed, in step 312, the sequence of the corresponding length may be obtained. Thereafter, in step 314, the L value is increased by 1, the process proceeds to step 302, the L value may be again compared with the M value. If the L value has been completed by the predetermined length, the process proceeds to step 330, so that the final sequence Q can be obtained.

FIGS. 4A and 4B are conceptually exemplified diagrams for explaining a method for designing a code according to an embodiment of the present disclosure.

Prior to referring to the figures, the example of FIGS. 4A and 4B is the case in which the bit channel index sequences $S_1, S_2, \ldots, S_T$ optimized for T code rates are calculated in advance and, And ST are calculated in advance and present. In addition, it is assumed that $|A1|=1$ and $|A_{i+1}|-|A|=1$. As described above, the size of each information bit set may be arbitrarily adjusted by adjusting the intervals of each code rates. $|A_{i+1}|-|A_i|=i$, $\forall I=1, \ldots, N-1$), that is, $A_1=\{1\}$, $A_2=\{1, 2\}$, $A_3=\{1, 2, 3\}$. It is assumed that $\alpha_i=1$.

FIGS. 4A and 4B may be described on the assumption of such a case. In addition, in FIGS. 4A and 4B, for convenience of description, a description may be given by giving a different form from the already used reference numerals.

First, penalties from $W_i$ to $W_N$ can be calculated using $S_1$ to $S_T$. The bit channel index 1 401 is completely included in the information set and is located at the top of all the code rates. Therefore, a $P_i(E_1)-P_i(E_{worst})$ value is always negative ($\{P_i(E_1)-P_i(E_{worst})\}^+=0$), and $W_1=0$.

Next, since 402 which is a bit channel index 2 is not included in the information set of $S_1$, the penalty is calculated as $W_2=\{P_1(E_2)-P_1(E_1)\}$. In this case, it is assumed that 402 which is a bit channel index 2 is included in $A_2, \ldots, A_N$. Similarly, for 403 which is a bit channel index 3, a penalty is calculated to be calculated as $W_3=\{P_1(E_3)-P_1(E_1)\}+\{P_2(E_3)-P_2(E_2)\}$. In this way, the penalty is calculated for the remaining indexes and always has a value greater than zero.

As a result, in the first step, since only $|A1|=1$ index is added to Q, 401 which is the bit channel index 1 is added to the first location (top) of the single polar code sequence Q, such that Q=(1).

In a second step, since the set of $S_1$ corresponding to the lowest code rate $R_1$ is calculated and inserted into the single polar code sequence Q, the penalty is calculated using $S_2$ to $S_T$. At this time, since 401 which is the channel bit index 1 is already inserted into the single polar code sequence Q, penalties W2 to WN from 402 which is the channel bit index 2 other than the 401 which is the channel bit index to N are calculated. Similar to the first step, $W_2=0$ if 402 which is the channel bit index 2 is included in all information sets from $S_2$ to $S_T$ other than $S_1$. Since 403 which is the channel bit index 3 is not included in the information set of $S_2$, it has a penalty greater than zero. 402 which is the channel bit index 2 is included in the single polar code sequence Q because the remaining channel bit indexes and penalties are both positive. As a result, a value of (1, 2) is set for the single polar code sequence Q considering $S_2$ which is the second step.

In the same method as above, it is assumed that 3 and 5 are included in the single polar code sequence Q in the third and fourth steps, respectively, and thus Q=(1, 2, 3, 5). In the fifth step, the penalties for each index may be calculated using $S_5$ to $S_T$ for the remaining indexes other than (1, 2, 3, 5).

Referring to FIG. 4B, the penalty is calculated on the assumption that the bit channel index 4 is included in the information set from $S_8$ to $S_T$, $W_4=\{P_6(E_4)-P_6(E_7)\}$. In this case, since the bit channel index 4 is excluded from the information set of $S_6$, only the penalty in $S_6$ is calculated. In this case, a penalty value of 417 which is the bit channel index 4 is calculated by the error rate difference from 416 which is an index 7 which is not included in the single sequence Q among the bit channel indexes included in the information set of $S_6$ and has the highest error rate.

In addition, the penalty for the bit channel index 7 is calculated as $W_7=\{P_5(E_7)-P_5(E_4)\}+\{P_7(E_7)-P_7(E_8)\}$. Note that the penalty at $S_7$ is $P_7(E_7)-P_7(E_8)$. This is because although the index having the highest bit error rate in the information set of $S_7$ is 5, 5 is already included in the Q set, and thus is not considered in penalty calculation. In this way, the index having the lowest penalty value among the bit channel indexes not previously included in the single sequence Q is added to the single sequence Q as the fifth index, and the method may be repeated T times to finally generate the single polar code sequence Q.

Hereinabove, the method of designing sequences for each length has been described. That is, the method for designing a sequence when the lengths of N are different like $2^5$, $2^6$, $2^7$, . . . has been described.

A method of designing a long single sequence for use in various lengths may now be described using a method of designing sequences (N=$2^5$, $2^6$, $2^7$, . . . ) for each length described above.

For example, when a code having a code length of N=$2^{10}$ or less is used, a sequence having code lengths of $2^3$, $2^4$, $2^5$, . . . , $2^9$ as the single sequence designed at N=$2^{10}$ may be extracted and used. That is, in order to use a sequence of N=$2^9$, a sequence having a code length of $2^9$ is designed while maintaining the order of indexes in the single sequence designed at N=$2^{10}$. Similarly, when the maximum code length N=$2^{10}$ is used, it is used in a short code using a sequence designed at N=$2^{10}$. The longest single sequence may be designed by designing a sequence from a short sequence to a long sequence using the design method described above.

The method for designing a single code is presented along with an example. First, the case of using the code length of N=$2^5$, $2^6$, . . . , $2^{10}$ (k=1, . . . , 6) is assumed. Here, i means indexes for each code length. Depending on the code length used, the design method may be extended to a longer length. In this case, according to the present disclosure, a method for designing a code having good performance even in the codes of N=$2^5$, $2^6$, . . . , $2^9$ which are a shorter length by using the single sequence designed as N=$2^{10}$.

Here, the fact that the code has good performance may mean that a block error rate and a bit error rate are low at the same signal to noise ratio, or that the signal to noise ratio necessary to achieve the same block (bit) error rate is low.

In this case, first, a sequence of minimum length N=$2^5$ is designed using the method for designing optimum codes for each length as described above. Next, the sequence of N=$2^6$ is designed using the sequence designed at N=$2^5$ as the reference sequence. In this case, it is possible to design a sequence of length N=$2^6$ while maintaining the index order of the reference sequence designed in a previous, that is, shorter length.

In this case, the difference from the existing method for designing sequences for each length is that the penalty is calculated to keep the order of the reference sequence designed at N=$2^5$. For example, if the index of the reference sequence (index equal to or less than 32) is not included in the final sequence, only the penalty of index 1 among the indexes of 32 or less is calculated, and penalties of indexes equal to or less than 32 except for 1 may be set not to deviate from the order of indexes of the reference sequence by approximately setting $W_i$ to be an infinite value or inputting a very large value. Therefore, when the first index is calculated, penalties of index 1 and indexes 33 to 63 which are equal to or greater than 33 are calculated, so that the index having the lowest penalty value is added to the final sequence. This process is repeated to design a sequence of length N=$2^6$. If 1 among indexes of 32 or less is added, an index to be added is determined by comparing a penalty of 2 which is an index of the subsequent order among sequences of 32 or less with penalties of indexes of 33 or more. When this process is repeated, indexes of 32 or less do not deviate from the order of the reference index sequence designed at the existing N=$2^5$, and the sequence having a length of N=$2^6$ can be designed.

That is, when the indexes of 32 or less are sequentially extracted in the thus designed N=$2^6$ sequence, the same sequence as the reference index sequence designed at N=$2^5$ is generated. By repeating this algorithm, the sequence designed at N=$2^6$ is designed again at N=$2^7$ as the reference sequence. In this case, the order of the reference sequence designed at N=$2^6$ can be maintained as it is. By designing a sequence by repeating the algorithm up to $N=2^{10}$ which is the longest length, a single sequence having a long length is designed to ensure performance at a short length. According to the code length used, the reference of the shortest length $N=2^5$ and the longest length $N=2^{10}$ may be set to be variously different values.

Hereinafter, the above contents may be described in more detail with reference to the accompanying drawings.

Figure 5:
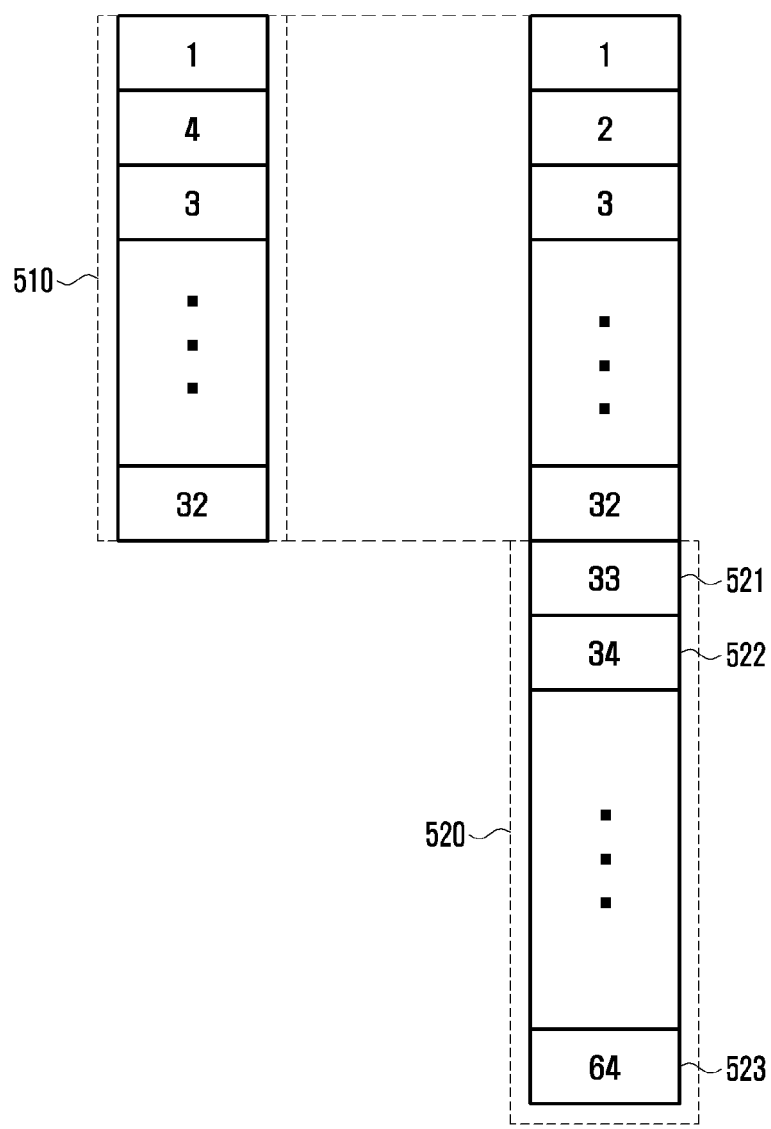
FIG. 5 illustrates a conceptual diagram for explaining a process for generating sequences of different lengths according to the present disclosure.

FIG. 5 illustrates a conceptual diagram for explaining a process for generating sequences of different lengths according to the present disclosure.

Referring to FIG. 5, an optimized bit channel index sequence 510 corresponding to a length of $2^5$ may be generated. Next, when the optimized bit channel index sequence corresponding to a length of $2^6$ is generated, the optimized bit channel index sequence 510 corresponding to a length of $2^5$ is used as it is. That is, as described above, the order of the reference sequence designed at $N=2^5$ is maintained as it is, and only the subsequent sequence 520 is newly defined. Therefore, in the case of generating the optimized bit channel index sequence corresponding to the length of $2^6$, in the newly defined sequence 520, the sequences having the sequence number 33 to 64 may be arranged in the order from the best channel to the worst channel.

When a sequence having a length of $2^7$ is generated in this way, the sequence having a length of $2^6$ is maintained as it is, and only the remaining sequences may be newly generated. In addition, even when a sequence having a length of $2^8$ is generated, the sequence having a length of $2^7$ may be maintained as it is and a sequence having the remaining length may be generated. If the desired maximum transmission length in the system is $2^{10}$, a length of up to $2^{10}$ may be generated using the above method.

Next, in the case of using the optimized bit channel index sequence designed in this way, since a length of data to be transmitted has a length of $2^5$ but it is already designed to meet an optimum length of $2^5$, the transmission efficiency can be maximized. In addition, if the length of the data to be transmitted has a length of $2^6$, since the sequence having a longer length is designed while maintaining a single sequence designed at $2^6$, it is possible to increase the transmission efficiency of $2^6$.

Figure 6:
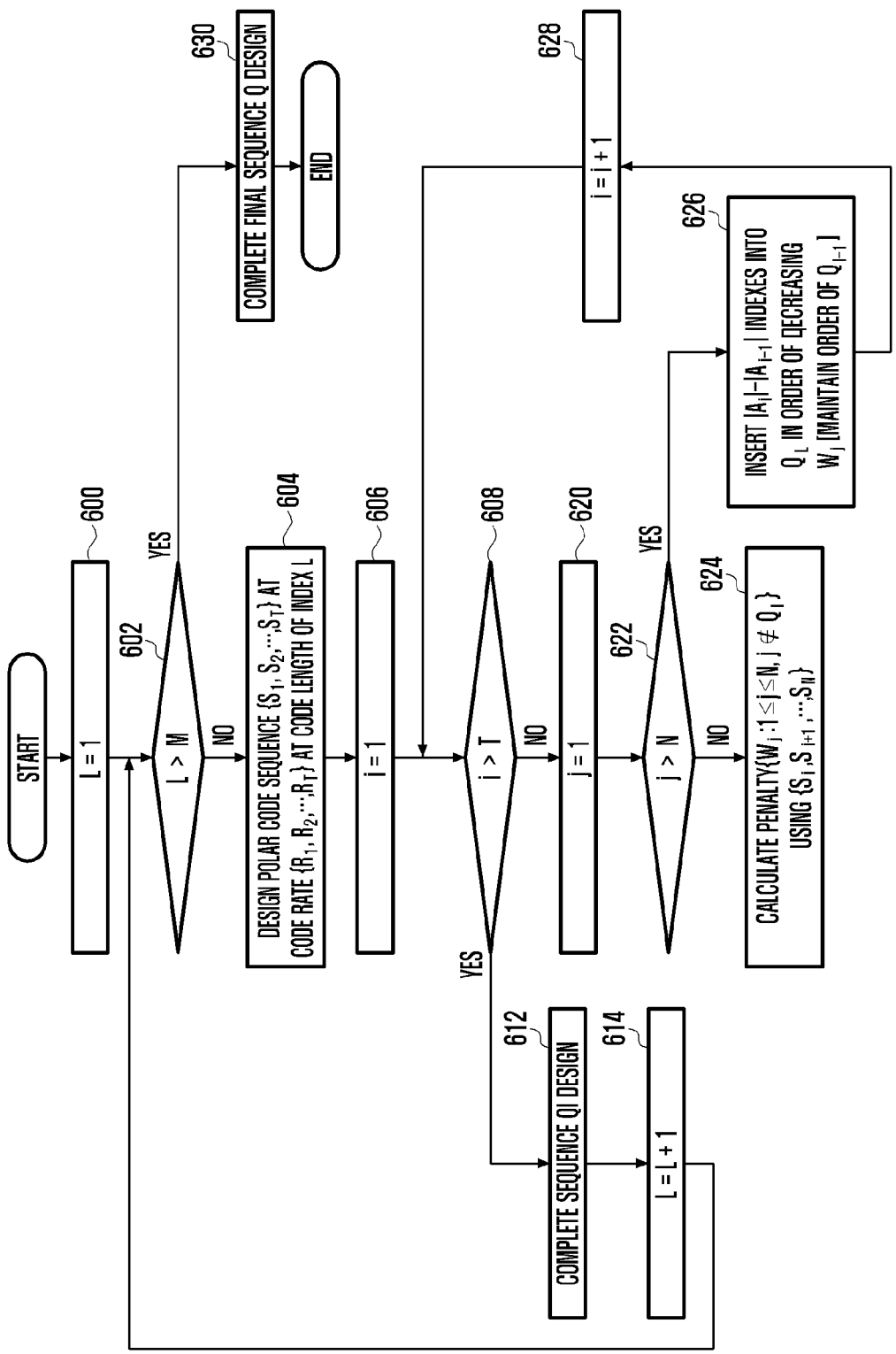
FIG. 6 illustrates a flowchart of a method for designing a single code sequence according to the present disclosure.

FIG. 6 illustrates a flowchart of a method for designing a single code sequence according to the present disclosure.

Referring to FIG. 6, in step 600, for the respective code rates, for example, $R_1, R_2, \ldots, R_T$ the optimized bit channel index sequences $S_1, S_2, \ldots, S_T$ are generated. Next, in step 602, an i value is set to be 1, and it is checked whether the i value is greater than a T value. As described above, when the i value is greater than the T value, the design of the final sequence may be completed. However, if the first i value is set to be 1 fh, the process proceeds to step 606 to set the j value to be 1. Next, the process proceeds to step 608, and it is checked whether the j value is greater than the N value Here, N may be the set code length. If it is determined as the check result of the step 608 that j is not greater than N, the process proceeds to the step 610, so that the penalty may be calculated using the Equation 3 or Equation 4 or the same concept as described above. That is, the penalty $W_j$ may be calculated at $S_i$. The operation of step 324 may be performed by the code length. Next, step 610 is performed for all code lengths, and then the process may proceed to step 616. If the process proceeds to step 616, the i value is increased by 1 and then step 604 is repeated.

Similar to FIG. 3 described above, in FIG. 6, the fact that the i value is greater than T means that the processing of polar code sequences for all the code rates is completed. Therefore, the i value may be greater than 1 and less than or equal to T. If it is determined as the check result of the step 604 that if the processing of the polar code sequences for all the code rates is not completed, j is not greater than N, the process proceeds to the step 606, so that the penalty may be calculated using the Equation 3 or Equation 4 or the same concept as described above. That is, the penalty $W_j$ may be calculated at $S_i$. Thereafter, it may be mapped to the single polar code sequence Q based on the calculated $W_i$ and inserted thereinto. Thereafter, the process proceeds to step 610, the i value is increased by 1. In this way, the single polar code sequence Q may be generated at each code rate.

If the optimized bit channel index sequence is generated at all the code rates for a specific length, the process proceeds from step 604 to step 620. Then, in step 612, the currently generated sequence may be determined as the final sequence that may be applied to all the code rates at a specific length. According to the above-described method, an optimum bit channel index sequence can be generated at each code rate for a specific length, and the generated final sequence may be upgraded.

The bit sequences generated by the above method may be set as shown in the following table.

First, when the target block error rate is 10% and a length is 32 ($2^5$), the optimized bit channel index sequence may be shown as in the following Table 1. In addition, it may be apparent to those skilled in the art that the code rate may be changed depending on the target block error rate.

TABLE 1

1 2 3 5 9 17 4 6 7 10 11 18 13 19 21 8 25 12 14 20 15 22 23 26 27 29 16 24 28 30 31 32

The numbers shown in the above Table 1 indicate channel indexes, and the channels are arranged in descending order of channels from a good channel to a bad channel according to the channel state.

In addition, when the target block error rate is 10% and the length is 64 ($2^6$), the optimized bit channel index sequence may be shown as in the following Table 2.

TABLE 2

1 2 3 5 9 17 4 33 6 7 10 11 18 13 19 34 21 35 8 25 37 12 41 14 20 15 49 22 36 23 26 38 27 39 42 29 16 43 50 45 24 51 53 28 40 57 30 44 31 46 52 47 54 55 58 32 59 61 48 56 60 62 63 64

The numbers shown in the above Table 2 indicate channel indexes, and the channels are arranged in descending order of channels from a good channel to a bad channel according to the channel state.

When the target block error rate is 10% and the length is 128 ($2^7$), the optimized bit channel index sequence may be shown as in the following Table 3.

TABLE 3

1 2 3 5 9 17 4 33 6 65 7 10 11 18 13 19 34 21 35 8 25 66 37 12 67 41 14 69 20 15 49 22 73 36 23 26 81 38 27 97 39 68 29 42 16 70 43 50 71 45 74 24 51 75 53 82 28 77 40 57 83 30 98 44 31 85 99 72 46 89 52 101 47 76 54 105 78 55 84 58 79 113 32 59 86 100 61 87 90 48 102 91 103 93 106 56 80 107 60 114 109 88 115 62 63 117 92 104 121 94 108 95 110 116 111 64 118 119 122 96 123 125 112 120 124 126 127 128

The numbers shown in the above Table 3 indicate channel indexes, and the channels are arranged in descending order of channels from a good channel to a bad channel according to the channel state.

When the target block error rate is 10% and the length is 256 ($2^8$), the optimized bit channel index sequence may be shown as in the following Table 4.

TABLE 4

1 2 3 5 9 17 4 33 6 65 7 10 129 11 18 13 19 34 21 35 8 25 66 37 12 67 41 14 130 69 20 49 15 131 73 22 36 133 23 81 26 38 137 27 97 39 68 29 42 145 16 70 43 50 161 71 45 132 74 51 24 75 193 134 53 82 28 77 135 40 57 83 138 30 98 85 139 31 44 146 99 141 72 89 46 147 52 101 47 162 76 149 54 105 163 78 55 153 136 84 58 113 194 79 165 32 59 140 86 195 169 61 100 87 142 197 90 48 148 177 102 143 91 201 150 103 93 106 56 164 151 209 80 154 107 60 114 166 155 109 225 167 115 88 196 62 157 170 117 63 144 198 171 92 178 104 121 199 173 94 202 179 152 95 108 203 181 210 156 110 205 168 185 116 211 158 111 226 64 118 213 159 172 227 119 200 217 174 122 180 229 175 96 123 204 182 233 125 206 183 112 212 186 241 207 160 187 214 120 228 189 215 218 176 230 124 219 231 126 221 234 184 208 127 235 188 242 237 216 243 190 191 245 220 232 249 222 236 223 128 238 244 239 192 246 247 250 224 251 253 240 248 252 254 255 256

The numbers shown in the above Table 4 indicate channel indexes, and the channels are arranged in descending order of channels from a good channel to a bad channel according to the channel state.

When the target block error rate is 10% and the length is 512 ($2^9$), the optimized bit channel index sequence may be shown as in the following Table 5.

TABLE 5

1 2 3 5 9 17 33 4 6 65 7 10 129 11 18 13 19 257 34 21 35 8 25 66 37 12 67 41 130 14 69 20 49 15 131 73 22 133 258 36 23 81 26 259 38 137 27 97 39 68 261 29 42 145 70 16 43 265 50 161 71 45 132 74 51 24 273 193 75 134 53 82 28 289 77 135 57 40 83 138 260 30 98 139 85 321 31 44 262 146 99 141 89 72 46 263 147 101 52 385 266 47 162 76 149 105 267 54 163 274 153 78 55 136 269 113 84 58 194 165 79 275 32 59 195 290 140 86 169 277 61 100 87 291 197 142 90 281 177 148 48 264 102 322 143 91 293 201 103 150 323 93 268 106 297 56 209 164 151 386 107 80 154 325 270 305 114 60 166 276 225 155 109 387 271 329 115 167 88 196 62 157 170 278 389 117 63 337 292 171 279 144 198 92 282 178 121 393 104 199 173 294 94 353 202 283 179 152 295 95 324 108 401 203 285 298 181 210 156 205 110 326 299 272 185 417 168 211 116 306 111 158 327 301 226 388 64 330 213 307 118 159 172 280 449 227 331 119 390 309 217 200 174 122 338 284 229 333 180 391 313 96 175 123 296 339 394 204 286 233 182 354 125 341 395 287 300 206 183 402 355 241 112 212 186 397 345 207 328 302 403 160 187 357 308 214 303 418 120 405 332 189 228 215 361 310 218 419 176 409 334 124 311 230 392 219 369 340 314 450 421 335 231 126 221 288 315 234 184 451 396 342 425 127 208 235 317 356 343 453 398 242 188 346 433 237 304 404 358 399 347 243 216 190 457 359 406 349 245 362 191 312 420 407 220 465 336 363 410 249 232 370 316 422 222 411 365 481 371 128 423 223 236 344 452 318 413 426 373 319 238 400 454 427 348 244 434 239 360 377 455 429 350 192 458 246 435 408 351 364 459 247 437 250 466 412 366 461 441 424 224 251 372 467 414 367 482 320 253 469 374 415 428 483 240 375 456 473 430 378 436 485 431 352 379 460 248 438 489 381 462 439 252 368 468 442 497 463 416 443 254 470 376 484 445 471 255 474 432 486 380 475 487 382 477 490 440 464 383 491 444 498 493 472 499 446 256 447 501 476 488 505 478 492 479 384 494 500 495 448 502 503 506 480 507 509 496 504 508 510 511 512

The numbers shown in the above Table 5 indicate channel indexes, and the channels are arranged in descending order of channels from a good channel to a bad channel according to the channel state.

When the target block error rate is 10% and the length is 1024 ($2^{10}$), the optimized bit channel index sequence may be shown as in the following Tables 6a and 6b. The following Tables 6a and 6b may be understood in a form in which the Table 6b after the Table 6a is connected.

TABLE 6a 1 2 3 5 9 17 33 4 6 65 7 10 129 11 18 13 257 19 34 21 35 513 8 25 66 37 12 67 41 130 69 14 20 49 15 131 73 22 133 258 36 81 23 26 259 137 38 27 97 261 39 68 514 145 29 42 70 265 43 16 515 161 50 71 45 132 74 517 273 51 24 193 75 134 53 521 82 289 28 77 135 57 83 40 138 260 30 529 98 321 139 85 31 44 262 146 99 141 545 89 72 263 46 147 385 101 266 52 516 47 162 149 76 577 267 105 54 163 274 518 153 78 269 55 136 113 194 84 58 165 275 519 79 641 522 195 32 59 290 140 86 169 277 523 61 100 291 87 197 769

TABLE 6a-continued 142 530 281 177 90 264 148 48 322 525 102 143 293 91 201 531 103 150 323 546 93 297
268 106 209 56 533 164 151 386 325 107 154 80 547 270 305 537 114 225 166 60 276
387 155 109 578 520 271 329 549 115 167 196 88 62 157 278 170 389 579 337 117 553
63 524 292 279 171 198 144 92 642 282 393 581 178 121 199 353 104 173 526 561 294
283 202 94 179 532 643 152 585 401 527 295 324 95 203 108 285 298 181 534 645 210
770 593 156 205 326 299 110 417 272 185 548 535 211 168 306 116 771 649 111 538
327 158 301 226 388 609 330 64 213 550 307 449 118 159 539 172 280 773 227 657 331
551 217 309 390 119 580 541 200 338 554 122 174 229 333 284 777 391 180 313 673
123 175 96 339 582 555 296 394 528 204 233 286 562 354 182 125 583 341 557 395 785
644 287 586 300 206 183 563 705 402 241 355 112 536 186 212 397 345 207 587 328
646 302 565 403 801 357 160 187 594 308 214 589 418 303 540 647 405 120 569 189
361 332 595 228 215 650 552 772 310 833 419 218 542 610 409 176 597 651 334 124
311 230 369 392 450 219 543 421 774 314 556 340 658 611 335 231 653 601 126 221
897 451 234 315 288 775 584 184 659 342 558 396 425 613 127 778 564 235 317 208
674 356 343 559 453 661 242 398 433 617 346 188 588 779 237 566 404 304 675 358
786 457 399 243 347 665 216 190 781 590 567 625 648 706 359 677 406 787 570 596
245 349 191 362 591 465 312 420 407 220 707 802 571 544 681 249 363 652 598 410
336 789 232 481 370 573 422 316 222 803 612 709 599 411 365 654 689 793 602 128

TABLE 6b 400 809 605 348 780 618 244 721 434 377 568 239 676 663 455 360 429 898 837 619 192 666
350 458 592 435 246 782 817 408 737 626 678 572 788 899 351 667 621 459 364 247 841 783
437 627 250 679 466 708 600 574 669 412 461 682 790 901 366 441 849 251 224 629 467 424
372 575 804 683 791 710 367 656 414 604 482 253 794 905 690 320 469 633 374 711 616 415
685 428 865 806 483 795 606 714 691 240 375 473 664 913 807 456 378 836 430 607 715 620
797 485 810 693 436 722 431 352 379 668 717 248 838 811 622 460 929 784 489 697 438 723
680 381 628 818 623 839 670 813 738 462 439 900 497 842 252 725 576 819 368 630 442 468
671 961 684 792 463 739 843 631 821 902 416 443 254 729 712 470 850 634 686 741 796 845
376 255 903 445 692 484 825 471 608 687 635 808 851 906 474 716 745 798 432 694 866 637
380 486 853 907 475 799 812 718 695 914 753 867 487 624 698 724 382 477 909 857 490 719
440 840 814 915 869 672 699 383 820 491 726 464 815 930 632 917 498 701 444 844 740 727
873 493 822 730 931 499 921 688 472 446 846 823 636 742 256 904 881 731 962 852 826 933
501 847 447 743 638 733 476 800 827 746 963 696 908 854 937 505 488 639 747 720 829 868
478 855 965 910 754 858 700 945 749 384 916 816 479 492 870 911 859 755 969 728 702 871
918 494 861 757 874 703 824 500 977 932 919 732 495 875 848 922 761 744 448 502 882 828
934 734 923 993 877 503 883 935 640 735 748 856 964 830 506 925 938 885 831 480 507 750
912 966 939 860 756 946 751 889 872 967 509 941 862 970 704 947 758 920 496 863 876 971
759 949 762 978 924 973 878 953 936 736 504 763 884 979 879 926 994 832 765 981 886 927

The numbers shown in the above Tables 6a and 6b indicate channel indexes, and the channels are arranged in descending order of channels from a good channel to a bad channel according to the channel state.

Next, when the target block error rate is 1% and the length is 32 ($2^5$), the optimized bit channel index sequence may be shown as in the following Table 7.

TABLE 7

1 2 3 5 9 17 4 6 7 10 11 18 13 19 21 25 8 12 14 20 15 22 23 26 27 29 16 24 28 30 31 32

The numbers shown in the above Table 7 indicate channel indexes, and the channels are arranged in descending order of channels from a good channel to a bad channel according to the channel state.

When the target block error rate is 1% and the length is 64 ($2^6$), the optimized bit channel index sequence may be shown as in the following Table 8.

TABLE 8

1 2 3 5 9 17 33 4 6 7 10 11 18 13 19 34 21 35 25 8 37 41 12 49 14 20 15 22 36 23 26 38 27 39 29 42 43 16 50 45 51 24 53 28 57 40 30 31 44 46 52 47 54 55 58 59 32 61 48 56 60 62 63 64

The numbers shown in the above Table 8 indicate channel indexes, and the channels are arranged in descending order of channels from a good channel to a bad channel according to the channel state.

When the target block error rate is 1% and the length is 128 ($2^7$), the optimized bit channel index sequence may be shown as in the following Table 9.

TABLE 9

1 2 3 5 9 17 33 4 65 6 7 10 11 18 13 19 34 21 35 25 66 8 37 67 41 12 69 49 14 20 73 15 22 81 36 23 26 97 38 27 39 68 29 42 43 70 16 50 71 45 74 51 24 75 53 82 77 57 28 83 40 98 30 85 31 99 44 89 101 72 46 52 47 105 76 54 113 78 55 58 84 79 59 32 86 61 100 87 90 48 102 91 103 93 106 56 107 80 114 60 109 115 88 62 117 63 92 121 104 94 95 108 110 116 111 64 118 119 122 123 96 125 112 120 124 126 127 128

The numbers shown in the above Table 9 indicate channel indexes, and the channels are arranged in descending order of channels from a good channel to a bad channel according to the channel state.

When the target block error rate is 1% and the length is 256 ($2^8$), the optimized bit channel index sequence may be shown as in the following Table 10.

TABLE 10

1 2 3 5 9 17 33 4 65 6 129 7 10 11 18 13 19 34 21 35 25 66 37 8 67 41 12 130 69 49 14
131 73 20 15 133 81 22 137 36 23 97 26 38 145 27 39 68 29 42 161 43 70 16 50 193
71 45 132 74 51 24 75 53 134 82 77 135 57 28 83 138 40 98 85 30 139 99 146 31 44
89 141 147 101 72 46 162 52 149 105 47 163 76 54 153 113 194 165 78 55 136 58 84
195 79 169 59 32 86 140 197 61 177 100 87 142 201 90 148 102 48 143 91 209 103
150 93 106 164 151 56 225 107 154 80 114 166 109 155 60 115 167 196 157 170 62
88 117 171 63 198 144 121 178 92 199 173 104 202 179 94 152 203 181 95 108 210
205 185 156 110 211 168 116 226 111 158 213 64 118 159 227 172 217 119 229 200
122 174 180 123 175 233 96 204 182 125 241 206 183 186 212 112 207 187 160 214
189 120 228 215 218 230 176 219 124 231 221 234 126 184 127 235 208 242 188 237
243 216 190 245 191 220 249 232 222 223 128 236 238 244 239 192 246 247 250 251
224 253 240 248 252 254 255 256

The numbers shown in the above Table 10 indicate channel indexes, and the channels are arranged in descending order of channels from a good channel to a bad channel according to the channel state.

When the target block error rate is 1% and the length is 512 ($2^9$), the optimized bit channel index sequence may be shown as in the following Table 11.

TABLE 11

1 2 3 5 9 17 33 4 65 6 129 7 10 257 11 18 13 19 34 21 35 25 66 37 8 67 41 130 12 69
49 131 14 73 20 15 258 133 81 22 259 137 36 23 97 26 261 145 38 27 39 265 68 29
42 161 43 70 273 193 16 50 71 45 132 74 51 289 75 24 53 134 82 321 77 135 57 83
28 138 260 40 98 385 85 139 30 262 146 99 31 89 141 44 263 147 101 266 72 46 162
149 105 52 267 47 163 274 76 153 113 54 269 194 165 275 78 55 136 58 84 195 290
79 169 277 59 197 291 32 86 140 177 281 61 100 87 322 293 201 142 90 264 148 323
102 143 91 297 48 209 103 386 150 93 325 106 268 305 225 164 151 387 56 107 154
329 270 80 114 166 109 276 155 60 271 389 115 337 167 196 157 393 170 278 62 88
117 353 171 292 279 198 63 121 282 178 144 92 401 173 199 294 283 104 202 179
94 295 417 324 203 285 152 181 298 95 108 210 205 185 299 326 449 211 156 306
110 272 301 327 168 116 226 111 388 213 330 307 158 227 64 118 159 331 217 172
280 309 390 338 119 229 333 122 313 391 200 174 339 284 394 233 180 123 175 354
96 296 341 204 395 286 125 182 241 355 402 287 345 397 183 206 300 186 403 212
357 112 207 328 302 187 418 405 160 361 308 214 303 189 419 120 215 228 332 409
369 310 218 450 421 311 230 334 176 219 392 124 314 451 340 425 335 231 221 315
234 126 453 288 342 396 184 433 127 235 317 356 343 208 242 457 398 346 237 188
404 243 358 399 304 347 465 190 216 359 245 406 349 362 191 481 420 407 312 249
363 220 410 336 370 232 422 365 411 316 222 371 423 452 413 128 223 426 236 318
344 373 427 454 319 238 377 400 434 348 244 429 455 239 360 458 435 350 192 246
408 459 437 351 247 364 466 250 461 441 412 467 366 251 224 424 372 482 367 414
469 253 320 483 374 415 428 473 375 240 485 456 378 430 436 489 379 431 352 460
248 438 381 497 462 439 252 442 468 368 463 443 416 254 470 445 255 376 484 471
474 486 432 475 380 487 477 490 382 440 383 491 464 498 493 444 499 472 446 256
501 447 476 505 488 478 479 384 492 494 500 495 448 502 503 506 507 480 509 496
504 508 510 511 512

The numbers shown in the above Table 11 indicate channel indexes, and the channels are arranged in descending order of channels from a good channel to a bad channel according to the channel state.

When the target block error rate is 1% and the length is 1024 ($2^{10}$), the optimized bit channel index sequence may be shown as in the following Tables 12a and 12b. The following Tables 12a and 12b may be understood in a form in which the Table 12b after the Table 12a is connected.

TABLE 12a 1 2 3 5 9 17 33 4 65 6 129 7 10 257 11 18 13 513 19 34 21 35 25 66 37 8 67 41 130 12
69 49 131 73 14 20 258 15 133 81 22 259 137 97 36 23 26 261 514 145 38 27 515 265
39 68 161 29 42 517 273 70 43 193 50 16 71 45 521 132 74 51 289 75 134 53 24 529
82 321 77 135 57 83 138 260 28 545 385 98 40 85 139 30 262 146 99 577 89 141 31
44 263 147 101 266 516 72 162 46 641 149 105 267 52 47 163 518 274 153 76 113
269 54 194 769 165 275 519 78 55 136 522 195 290 58 84 169 79 277 523 59 197 291
140 86 32 177 281 530 61 525 322 201 293 100 87 142 531 90 323 264 148 297 102
143 91 546 48 209 533 386 103 325 150 93 547 305 268 106 225 537 164 151 387 56
329 107 578 154 549 270 114 80 166 389 109 276 155 579 520 271 60 337 115 553
167 196 157 393 170 278 642 581 117 62 88 353 561 524 171 292 279 198 63 121
643 401 282 585 178 144 173 199 92 526 294 283 202 179 770 645 104 532 593 417
94 527 295 324 285 203 181 152 298 95 771 649 210 534 108 205 609 449 185 299

TABLE 12a-continued 326 548 211 535 156 773 306 110 657 272 301 327 538 226 168 116 388 213 111 330
307 550 158 777 539 227 673 64 217 331 118 159 309 551 390 172 280 580 541 338
229 554 119 333 785 313 391 122 200 705 174 339 555 582 233 394 284 180 123 175
562 354 801 341 96 296 528 583 557 395 241 125 204 644 286 182 586 563 355 402
345 397 287 183 206 300 587 833 565 403 357 646 186 536 212 112 207 594 418 589
328 569 302 187 405 647 361 897 595 160 214 308 650 772 303 540 189 419 409 369
610 215 228 332 120 597 552 651 310 218 450 421 542 774 611 658 311 230 601 334
219 653 176 392 124 451 543 314 425 340 556 775 231 335 659 613 221 778 453 315
234 126 674 584 433 342 288 558 396 661 617 184 127 235 317 779 564 457 343 559
675 356 786 242 208 398 665 237 346 625 588 781 706 677 188 465 243 566 404 358
399 347 304 787 567 590 707 245 802 681 359 648 190 349 216 406 570 481 596 362
789 591 191 249 420 407 571 312 709 803 363 220 410 689 598 652 544 793 370 573
336 834 232 422 365 411 713 599 805 612 222 316 371 654 602 423 413 452 835 776
223 128 660 809 721 426 614 655 373 236 603 318 344 560 898 427 837 615

TABLE 12b 454 319 662 605 377 817 737 238 618 780 434 400 429 455 348 244 663 676 899 239
568 841 619 458 435 666 360 782 626 350 192 246 592 901 678 621 459 667 788 437
408 849 783 351 572 247 627 466 364 679 461 708 669 250 441 905 682 865 790 629
467 574 600 251 412 366 683 804 791 710 224 482 575 424 633 372 469 913 367 253
794 690 414 656 685 604 711 483 806 320 473 374 415 795 714 691 616 428 929 485
606 807 375 836 240 715 797 693 664 378 810 456 607 430 722 620 489 717 436 379
697 961 811 838 431 723 352 497 818 668 381 622 248 460 784 813 839 438 738 680
628 725 900 623 842 819 670 439 462 739 252 729 442 843 576 630 671 468 368 821
463 684 792 902 850 443 741 631 254 845 416 825 470 903 634 712 686 851 445 745
255 906 796 471 484 376 692 635 687 866 474 608 808 853 907 716 637 798 753 694
486 475 867 432 914 380 857 799 909 695 718 487 812 477 915 869 698 490 724 382
624 719 930 840 814 440 699 491 383 917 873 672 726 820 815 498 464 701 931 493
632 727 740 844 921 444 881 499 822 730 962 933 823 742 846 256 446 501 472 688
731 904 636 826 963 852 937 847 447 743 733 505 827 746 638 965 476 800 854 908
696 945 639 747 829 488 868 855 478 720 754 969 910 858 749 700 479 916 384 755
870 492 911 816 859 977 702 728 871 757 918 861 494 874 703 993 500 932 919 824
761 495 875 732 922 848 882 448 502 744 934 877 923 734 828 883 503 935 964 925
735 640 506 938 748 830 856 885 507 939 831 966 480 750 889 912 946 860 509 756
941 967 751 872 970 947 862 704 758 971 920 496 949 863 759 876 978 762 973 953
924 979 878 763 504 936 736 884 994 879 926 981 765 995 832 886 927 508 940 985
887 752 997 968 890 942 510 948 1001 891 943 511 864 972 760 950 893 1009 974
951 764 954 980 880 975 955 928 766 982 957 767 888 996 983 986 998 944 987 892
512 999 989 1002 894 952 895 1003 976 1010 956 1005 1011 984 958 768 1013 959
988 1017 1000 990 991 896 1004 1006 1012 1007 960 1014 1015 1018 1019 992
1021 1008 1016 1020 1022 1023 1024

The numbers shown in the above Tables 12a and 12b indicate channel indexes, and the channels are arranged in descending order of channels from a good channel to a bad channel according to the channel state.

Next, when the target block error rate is 0.1% and the length is 64 ($2^6$), the optimized bit channel index sequence may be shown as in the following Table 13.

TABLE 13

1 2 3 5 9 17 33 4 6 7 10 11 18 13 19 34 21 35 25 37 8 41 12 49 14 20
15 22 23 36 26 38 27 39 29 42 43 50 16 45 51 53 24 57 28 40 30 31 44
46 52 47 54 55 58 59 32 61 48 56 60 62 63 64

The numbers shown in the above Table 13 indicate channel indexes, and the channels are arranged in descending order of channels from a good channel to a bad channel according to the channel state.

Next, when the target block error rate is 0.1% and the length is 128 ($2^7$), the optimized bit channel index sequence may be shown as in the following Table 14.

TABLE 14

1 2 3 5 9 17 33 65 4 6 7 10 11 18 13 19 34 21 35 25 66 37 67 8 41 69
49 12 73 14 81 20 15 22 97 23 36 26 38 27 39 29 68 42 43 70 50 45 71
16 74 51 75 53 24 82 77 57 83 28 98 85 40 30 99 89 31 44 101 72 46
105 52 47 113 76 54 55 78 58 84 79 59 86 32 61 87 100 90 102 91 48
103 93 106 107 56 114 80 109 60 115 117 62 88 63 121 92 104 94 95
108 110 116 111 118 64 119 122 123 96 125 112 120 124 126 127 128

The numbers shown in the above Table 14 indicate channel indexes, and the channels are arranged in descending order of channels from a good channel to a bad channel according to the channel state.

Next, when the target block error rate is 0.1% and the length is 256 ($2^8$), the optimized bit channel index sequence may be shown as in the following Table 15.

TABLE 15

1 2 3 5 9 17 33 65 4 129 6 7 10 11 18 13 19 34 21 35 25 66 37 67 41 8 130 69 49 12
131 73 133 14 81 20 15 137 97 22 145 36 23 26 161 38 27 39 29 68 193 42 43 70 50
45 71 16 132 74 51 75 53 134 82 24 77 57 135 83 138 28 98 85 139 40 99 146 30 89
141 31 101 147 44 162 149 105 72 46 163 52 47 153 113 194 76 165 54 195 169 55

TABLE 15-continued 78 136 58 84 79 197 177 59 86 140 201 32 61 87 100 209 142 90 148 102 143 91 48
225 103 93 150 106 151 164 107 56 154 114 109 166 155 80 115 60 167 157 196 170
117 62 88 171 121 198 63 178 173 199 144 92 202 179 104 203 94 181 210 152 95
205 185 108 211 156 110 226 213 116 168 111 158 227 217 159 118 64 229 172 119
122 233 200 174 123 180 175 241 96 204 125 182 183 206 186 212 207 112 187 214
160 189 215 228 120 218 230 219 176 124 231 221 234 126 235 184 127 242 208 237
188 243 245 190 216 191 249 220 232 222 223 128 236 238 244 239 246 192 247 250
251 224 253 240 248 252 254 255 256

The numbers shown in the above Table 15 indicate channel indexes, and the channels are arranged in descending order of channels from a good channel to a bad channel according to the channel state.

Next, when the target block error rate is 0.1% and the length is 512 ($2^9$), the optimized bit channel index sequence may be shown as in the following Table 16.

TABLE 16

1 2 3 5 9 17 33 4 65 6 129 7 10 257 11 18 13 19 34 21 35 25 66 37 67 41 8 130 69 49
131 12 73 258 133 81 14 20 15 259 137 97 22 261 145 36 23 26 265 161 38 27 273
193 39 68 29 42 289 43 70 50 45 71 132 16 74 51 321 75 53 385 134 82 24 77 57 135
83 260 138 98 28 85 139 262 40 99 146 89 30 141 263 101 31 147 266 44 162 149
105 267 72 46 163 153 274 113 52 269 194 47 165 76 275 54 195 169 290 277 55 78
136 58 197 84 291 79 177 281 59 322 201 86 293 140 61 32 87 323 100 209 297 142
90 264 386 325 225 148 143 102 305 91 48 103 387 93 150 329 106 268 151 164 389
107 154 337 56 270 114 109 166 155 276 393 80 271 115 353 167 157 401 60 196
170 117 278 62 171 279 88 121 198 292 417 178 63 282 173 199 294 144 92 283 179
202 449 295 104 285 203 181 324 94 298 210 152 95 205 185 299 108 326 211 306
301 226 327 156 213 110 388 307 272 330 227 217 116 111 168 331 158 309 390 229
159 118 64 338 333 313 172 280 119 391 233 339 394 122 354 241 341 200 174 395
123 284 180 175 296 355 125 96 402 345 204 286 397 182 357 403 287 183 206 300
186 418 361 405 212 207 112 187 328 302 419 409 369 214 308 189 303 160 450 421
215 228 332 120 310 218 451 425 311 230 219 334 392 314 453 433 124 176 340 231
335 221 315 234 126 457 342 396 317 235 288 127 184 343 242 356 465 237 398 346
208 243 404 399 188 358 347 481 304 245 359 349 190 406 216 362 249 191 407 420
363 410 312 370 365 220 422 411 336 232 371 423 222 413 316 452 426 373 223 128
236 318 427 377 454 344 319 434 238 429 455 400 348 244 435 239 458 360 459 437
350 246 192 466 408 351 247 461 441 364 250 467 251 412 482 366 469 372 424 224
253 367 483 414 473 415 374 320 485 428 375 489 240 378 456 430 379 436 431 497
352 381 460 248 438 439 462 442 252 468 463 368 443 254 470 416 445 255 471 484
376 474 486 475 432 380 487 477 490 382 491 440 383 498 464 493 499 444 501 446
472 256 447 505 476 488 478 479 384 492 494 500 495 502 448 503 506 507 480 509
496 504 508 510 511 512

The numbers shown in the above Table 16 indicate channel indexes, and the channels are arranged in descending order of channels from a good channel to a bad channel according to the channel state.

Next, when the target block error rate is 0.1% and the length is 1024 ($2^{10}$), the optimized bit channel index sequence may be shown as in the following Tables 17a and 17b. The following Tables 17a and 17b may be understood in a form in which the Table 17b after the Table 17a is connected.

TABLE 17a 1 2 3 5 9 17 33 4 65 6 129 7 10 257 11 18 13 513 19 34 21 35 25 66 37 67 41 130 8 69
49 131 73 12 258 133 81 14 259 20 137 15 97 261 514 22 145 36 23 515 265 26 161
517 38 27 273 193 39 68 29 42 521 289 43 70 50 529 45 71 321 132 16 74 51 545 75
53 134 385 82 77 24 57 135 577 83 260 138 98 85 28 139 641 262 99 146 40 89 141
30 263 147 101 31 266 769 516 44 162 149 105 267 72 163 46 518 274 153 113 269
52 47 194 165 519 275 76 522 54 195 290 169 277 55 78 523 136 197 291 58 177 84
281 79 530 59 525 322 201 293 86 531 323 61 140 32 209 297 87 100 546 142 90 533
386 325 264 148 305 225 143 102 91 547 537 387 48 103 329 93 150 578 549 106 268
389 151 164 337 579 107 553 154 270 56 114 393 109 642 166 155 276 581 353 520
271 80 561 115 167 157 196 60 401 643 170 117 278 585 770 417 524 62 171 279 292
121 198 645 88 593 282 178 63 173 199 526 294 283 144 179 771 202 92 649 449 532
609 527 295 285 203 181 104 324 94 298 773 657 210 534 205 185 152 95 299 326
211 108 777 535 548 673 306 301 327 538 226 213 388 156 110 307 330 785 705 550
272 539 227 116 168 111 217 331 158 309 801 551 541 390 229 580 338 159 118 64
554 333 313 172 280 391 119 233 339 555 394 582 833 122 200 174 354 562 341 241

TABLE 17a-continued 123 557 284 395 583 180 175 644 355 563 586 897 402 125 296 528 345 96 397 204
286 182 587 357 565 403 287 646 183 594 206 300 418 589 361 569 405 647 186 595
419 772 369 650 212 207 536 187 328 112 302 409 610 214 597 450 421 651 189 308
303 540 160 774 215 228 611 332 658 120 552 601 310 218 451 653 425 542 775 613
659 311 230 219 334 453 543 392 778 314 433 176 124 340 231 674 617 661 221 556
335 457 315 234 779 675 126 584 342 558 396 317 235 665 625 786 288 781 465 706
677 127 184 564 343 242 559 356 237 787 481 707 681 346 802 398 243 588 566 208
404 399 358 188 789 347 709 689 803 245 567 359 590 304 349 648 406 190 570 362
216 596 249 793 591 191 407 420 713 571 834 363 805 410 598 652 312 370 573 220
365 544 422 411 835 721 809 599 371 612 898 336 654 232 602 423 222 837 737 413
316 817 452 373 776 426 660 655 603 614 223 899 128 236 318 841 377 427 344 615
454 605 560 662 434 618 319 904 429 780 455 238 849 663 676 435 400 619 458 244
239 905 865 666 348 626 782 568 360 621

TABLE 17b 437 459 678 667 246 350 788 192 783 592 627 466 461 441 679 247 351 408 669 572
708 913 364 629 467 682 929 790 250 482 683 251 574 633 469 791 804 710 600 366
412 690 794 483 253 575 685 372 473 367 424 224 711 961 414 691 806 795 656 714
604 485 374 415 320 807 693 797 715 616 428 836 375 606 810 489 722 697 717 378
240 664 607 456 430 811 838 497 723 379 620 818 813 436 431 738 839 725 381 352
668 900 622 819 842 460 248 784 739 438 729 628 623 821 843 680 439 741 902 670
462 442 252 850 671 630 468 463 576 845 825 684 368 792 903 443 631 745 851 906
254 470 445 634 753 866 853 712 686 907 255 416 471 635 484 796 692 687 376 867
474 637 808 914 608 857 716 798 909 486 475 694 869 915 799 432 380 487 477 695
718 930 812 873 490 698 917 724 719 382 624 491 699 931 840 814 383 440 881 921
498 726 493 701 820 815 962 672 933 464 727 499 740 844 963 632 822 730 444 937
501 823 731 742 846 256 446 904 965 505 945 826 472 688 636 852 743 847 733 447
827 746 969 638 854 908 476 829 747 800 639 696 855 977 868 754 488 749 478 910
858 755 720 916 479 993 911 870 859 700 384 492 816 757 871 861 918 702 874 728
761 494 919 703 932 500 875 495 922 824 882 877 732 934 923 502 848 448 883 744
734 935 925 503 828 964 938 885 506 735 640 748 939 830 889 507 856 966 831 946
750 509 941 480 967 912 860 756 751 947 970 872 971 949 862 758 704 978 920 863
496 759 973 953 876 762 979 763 924 994 878 981 504 884 936 736 765 879 995 926
985 927 886 832 997 508 940 887 1001 752 890 968 510 942 891 948 511 943 1009
864 893 972 760 950 951 974 954 764 980 975 880 955 766 982 928 957 767 983 996
888 986 998 987 944 892 999 512 989 1002 894 1003 952 895 1010 976 1005 1011
956 1013 958 984 768 959 1017 988 1000 990 991 896 1004 1006 1012 1007 1014
960 1015 1018 1019 992 1021 1008 1016 1020 1022 1023 1024

The numbers shown in the above Tables 17a and 17b indicate channel indexes, and the channels are arranged in descending order of channels from a good channel to a bad channel according to the channel state.

The contents of the above Tables 1 to 17b described above are configured to have different optimized bit channel index sequences according to each code rates. However, when the configuration is made as shown in the above Tables 1 to 17b, the complexity of the terminal may be increased. Therefore, as described in the second embodiment of the present disclosure, only one sequence having the maximum length is configured. When data having a short length is to be transmitted using the sequence, the sequence of the bit channel index optimized to meet the corresponding length may be selected and used. As described above, if the maximum length is assumed to be 1024, it can be configured as follows depending on the required or target block error rate.

When the target block error rate is 10% and the single sequence of the polar code is used, the optimized bit channel index sequence may be shown as in the following Tables 18a and 18b. The following Tables 18a and 18b may be understood in a form in which the Table 18b after the Table 18a is connected.

TABLE 18a 1 2 3 5 9 17 33 4 6 65 7 10 129 11 18 13 257 19 34 21 35 8 25 66 37 67 12 41 130 69
14 49 20 15 131 73 22 133 258 36 81 23 26 259 137 38 27 97 261 39 68 145 29 42 265
70 43 16 161 50 71 45 132 74 273 51 193 24 75 134 53 289 82 77 28 135 57 83 138 40
260 321 30 98 139 85 262 31 44 146 99 141 89 385 263 72 147 46 101 266 52 47 513
514 515 517 521 529 545 516 162 76 149 577 54 105 267 163 274 518 78 55 153 136
269 84 58 79 113 194 165 275 519 641 522 32 59 140 86 195 290 169 277 523 100 61
87 291 142 197 769 530 90 281 48 148 177 264 102 322 525 143 91 293 201 531 150
103 323 546 93 268 106 297 56 164 151 209 533 386 80 154 107 325 547 270 305 537
60 114 166 276 155 109 225 387 578 520 271 329 549 167 88 115 196 62 157 170 278
389 579 63 117 337 553 524 292 144 198 171 279 92 642 282 581 178 104 121 393
199 173 294 94 353 526 561 202 283 179 532 643 152 585 527 295 108 95 324 401
203 285 298 181 534 645 210 770 593 156 110 205 326 299 272 168 185 417 548 535
116 211 306 771 649 158 111 538 327 301 226 388 609 64 330 118 213 550 307 159
172 280 449 539 773 227 657 331 551 119 390 309 200 217 580 541 174 122 338 554
284 180 229 333 777 391 175 96 313 673 123 296 339 582 555 394 528 204 286 182
233 562 354 125 583 341 557 395 785 644 287 586 300 206 183 563 402 355 112 212
186 241 705 536 397 345 207 587 328 646 302 565 403 160 187 357 801 594 308 214
589 303 418 540 647 120 405 569 332 228 189 215 361 595 650 552 772 310 833 218

TABLE 18a-continued 419 542 610 176 409 597 651 334 230 124 311 392 219 369 340 314 450 543 421 774
556 658 611 335 231 653 601 126 221 897 288 315 234 184 451 775 584 659 396 342
558 425 613 208 127 778 564 235 317 674 356 343 559 453 661 398 188 242 346 433
617 588 779 237 566 304 404 675 358 786 399 347 216 243 190 457 665 781 590 567
625 648 706 359 677 406 787 570 596 349 191 245 362 591 312 420 407 220 465 707
802 571 544 681

TABLE 18b 336 363 410 232 249 652 598 789 370 316 422 222 411 365 481 573 803 612 709 599
654 689 793 602 371 236 223 128 423 834 344 452 660 776 318 560 413 805 614 426
655 713 603 373 319 835 238 615 400 454 427 662 809 605 348 780 618 244 721 434
239 360 377 568 676 663 455 429 898 837 619 350 192 666 458 592 246 435 782 817
408 737 626 678 572 788 899 351 667 621 364 459 247 841 783 437 627 250 679 466
708 600 574 669 412 366 461 682 790 901 441 849 424 224 251 629 372 467 575 804
683 791 710 414 367 656 604 482 320 253 794 905 690 469 633 374 711 616 415 685
428 865 806 483 795 606 714 691 240 375 456 473 664 913 807 430 378 836 607 715
620 797 436 485 810 693 722 431 352 379 668 717 460 248 838 811 622 929 784 438
489 697 723 680 381 628 818 623 839 670 813 738 462 439 900 252 368 468 442 497
842 576 725 819 630 671 961 684 792 463 739 843 631 821 902 416 443 254 729 712
470 850 634 686 741 796 845 376 484 445 471 255 692 903 825 608 687 635 808 851
906 474 716 745 798 432 694 866 637 486 380 853 907 475 799 812 718 695 914 753
867 487 624 698 724 382 477 909 857 490 719 440 840 814 915 869 672 699 464 383
820 491 726 815 930 632 444 498 917 701 844 740 727 873 493 822 730 931 472 499
921 688 446 846 823 636 742 256 904 881 731 962 852 826 933 447 501 847 743 638
733 476 800 827 746 963 696 908 854 937 488 505 639 747 720 829 868 478 855 965
910 754 858 700 945 749 492 479 384 916 816 870 911 859 755 969 728 702 871 918
494 861 757 874 703 824 500 977 932 919 732 495 875 848 922 761 744 448 502 882
828 934 734 923 993 877 503 883 935 640 735 748 856 964 830 506 925 938 885 831
480 507 750 912 966 939 860 756 946 751 889 872 967 509 941 862 970 704 947 758
920 496 863 876 971 759 949 762 978 924 973 878 953 936 736 504 763 884 979 879
926 994 832 765 981 886 927 940 508 995 752 887 968 985 942 890 510 948 997 943
864 891 972 760 511 950 1001 893 974 951 764 880 980 954 1009 975 928 955 766
982 888 996 957 983 767 986 944 998 892 987 999 512 894 989 1002 952 976 895
1003 956 1010 1005 984 1011 958 768 959 1013 988 1000 1017 990 1004 991 896
1006 1012 1007 960 1014 1015 1018 992 1019 1021 1008 1016 1020 1022 1023 1024

The numbers shown in the above Tables 18a and 18b indicate channel indexes, and the channels are arranged in descending order of channels from a good channel to a bad channel according to the channel state.

When the target block error rate is 1% and the single sequence of the polar code is used, the optimized bit channel index sequence may be shown as in the following Tables 19a and 19b. The following Tables 19a and 19b may be understood in a form in which the Table 19b after the Table 19a is connected.

TABLE 19a 1 2 3 5 9 17 33 4 6 65 7 10 129 11 18 13 19 34 21 35 25 257 513 66 8 37 67 41 12 130
69 49 14 131 20 73 15 258 133 22 81 259 137 36 23 26 97 261 514 38 145 27 515 39
265 68 29 42 161 517 43 70 273 16 50 193 71 45 521 132 74 51 289 24 75 53 134 529
82 321 77 135 28 57 83 138 260 545 40 98 385 30 85 139 262 146 31 99 577 44 89
141 263 147 101 266 516 72 46 162 641 52 149 47 105 267 163 518 274 76 54 153
113 269 194 769 165 275 519 78 55 136 522 58 84 195 290 79 169 277 523 59 32 86
140 197 291 61 177 281 530 525 100 87 322 293 142 201 531 90 264 148 323 48 102
143 91 297 546 209 533 103 386 150 93 325 547 106 268 305 164 151 56 225 537 387
107 154 329 578 549 270 80 114 166 60 109 276 155 271 389 579 520 115 337 553
167 196 157 393 170 278 642 581 88 62 117 353 561 524 171 292 279 63 198 144 92
121 643 282 178 401 585 199 173 526 294 283 104 202 179 770 645 532 593 94 295
417 527 324 152 203 285 181 298 95 771 649 108 210 534 205 609 185 299 326 449
548 156 110 211 535 773 306 657 272 301 327 538 168 116 226 111 388 158 213 330
307 550 777 539 64 118 159 227 673 331 172 217 280 309 551 390 580 541 338 119
229 554 333 785 200 122 313 391 705 174 339 555 582 284 394 180 123 175 233 562
354 801 96 296 341 528 583 557 204 395 286 182 125 241 644 586 563 355 402 287
345 397 206 183 300 587 833 565 186 403 212 357 646 536 112 207 594 328 302 187
418 589 569 405 647 160 361 897 595 308 214 650 772 303 540 189 419 120 228 215
332 409 369 610 597 552 651 310 218 450 421 542 774 611 658 311 230 601 334 176
219 653 392 124 314 451 543 340 425 556 775 335 231 659 613 221 778 315 234 126
453 674 584 288 342 396 184 433 558 661 617 127 235 317 779

TABLE 19b 564 356 343 208 242 457 675 559 786 398 346 188 237 665 625 588 781 706 677 404
243 566 358 399 304 347 465 787 567 590 707 216 190 359 245 802 681 648 406 349
570 596 362 191 481 789 591 420 407 312 220 249 571 709 803 363 410 689 598 652
544 793 336 370 573 834 232 422 365 411 713 599 805 612 316 222 371 654 602 423
452 413 835 776 223 128 660 809 721 426 614 655 236 318 344 373 603 560 898 427
837 615 454 319 662 605 238 377 817 737 618 780 400 434 348 244 429 455 663 676
899 239 568 841 619 360 458 435 666 782 626 350 192 246 592 901 678 621 408 459
667 788 437 849 783 351 572 247 627 364 466 679 250 461 708 669 441 905 682 865
790 629 412 467 574 600 366 251 683 804 791 710 224 424 372 482 575 633 367 414
469 913 253 794 690 656 685 604 711 320 483 806 374 415 428 473 795 714 691 616
929 375 240 485 606 807 836 715 797 693 664 456 378 810 607 430 722 620 436 489
717 379 697 961 811 838 431 723 352 460 248 438 381 497 818 668 622 784 813 839
738 680 628 725 900 623 842 819 670 462 439 739 252 729 442 843 576 630 671 468
368 821 463 684 792 902 850 443 741 631 416 254 845 825 470 903 634 712 686 851
445 745 255 906 796 376 484 471 692 635 687 866 474 608 808 853 907 716 637 798
753 694 486 432 475 867 914 380 857 799 909 695 718 487 812 477 915 869 698 490
724 382 624 719 930 840 814 440 699 383 491 917 873 672 726 820 815 464 498 701
931 493 632 727 740 844 921 444 881 499 822 730 962 933 823 742 846 472 446 256
501 688 731 904 636 826 963 852 937 847 447 743 733 476 505 827 746 638 965 800
854 908 696 945 639 747 829 488 868 855 478 720 754 969 910 858 749 700 479 916
384 755 870 492 911 816 859 977 702 728 871 757 918 861 494 874 703 993 500 932
919 824 761 495 875 732 922 848 882 448 502 744 934 877 923 734 828 883 503 935
964 925 735 640 506 938 748 830 856 885 507 939 831 966 480 750 889 912 946 860
509 756 941 967 751 872 970 947 862 704 758 971 920 496 949 863 759 876 978 762
973 953 924 979 878 763 504 936 736 884 994 879 926 981 765 995 832 886 927 508
940 985 887 752 997 968 890 942 510 948 1001 891 943 511 864 972 760 950 893
1009 974 951 764 954 980 880 975 955 928 766 982 957 767 888 996 983 986 998
944 987 892 512 999 989 1002 894 952 895 1003 976 1010 956 1005 1011 984 958
768 1013 959 988 1017 1000 990 991 896 1004 1006 1012 1007 960 1014 1015 1018
1019 992 1021 1008 1016 1020 1022 1023 1024

The numbers shown in the above Tables 19a and 19b indicate channel indexes, and the channels are arranged in descending order of channels from a good channel to a bad channel according to the channel state.

When the target block error rate is 0.1% and the single sequence of the polar code is used, the optimized bit channel index sequence may be shown as in the following Tables 20a and 20b. The following Tables 20a and 20b may be understood in a form in which the Table 20b after the Table 20a is connected.

TABLE 20a 1 2 3 5 9 17 33 4 65 6 7 129 10 257 11 18 13 513 19 34 21 35 25 66 37 67 8 41 130 69
12 49 131 73 258 133 14 81 20 15 259 137 22 97 261 514 145 23 36 515 26 265 161
517 38 27 273 39 29 68 193 42 521 289 43 70 50 529 16 45 71 132 74 51 321 545 75
53 385 134 24 82 77 57 135 577 83 260 138 28 98 85 139 641 262 40 30 99 146 89
141 263 31 44 101 147 266 516 769 162 149 72 46 105 267 163 518 52 47 153 274
113 269 194 76 165 519 275 522 54 195 169 290 277 55 78 523 136 58 84 79 197 291
177 281 530 59 525 322 86 140 201 293 531 32 61 87 323 100 209 297 546 142 90
533 264 386 325 148 102 143 91 48 225 305 547 537 103 387 93 150 329 578 549 106
268 151 164 389 107 56 154 337 579 553 270 114 80 109 166 155 276 393 642 581
271 60 115 353 520 561 167 401 157 196 643 170 117 278 585 524 62 88 171 198 63
121 279 292 770 645 417 593 178 282 173 199 526 294 144 92 283 202 179 771 649
449 532 609 527 295 104 285 203 94 181 324 298 773 657 210 534 152 95 205 185
299 108 326 211 777 535 548 673 306 301 327 538 156 110 226 213 388 307 272 785
330 550 539 116 168 111 158 227 705 217 331 309 551 541 390 580 159 118 64 229
801 338 554 333 313 172 280 119 391 122 233 339 555 394 833 582 354 200 174 562
123 180 175 241 341 557 284 395 583 644 296 96 204 125 355 563 586 402 528 345
286 397 897 182 587 357 565 403 287 646 183 594 206 300 186 418 589 361 569 405
647 595 212 207 112 187 328 302 419 772 650 536 409 369 610 214 308 597 160 189
303 450 421 651 540 774 215 228 611 332 658 120 552 601 310 218 451 653 425 542
775 613 659 311 230 219 334 392 314 453 543 778 433 176 124 340 231 674 617 661
335 221 556 315 234 126 457 779 675 584 342 558 396 317 235 665 625 786 288 184
127 781 343 242 356 465 564 706 559 677 208 237 787 398 346 188 243 404 399 358
347 481 588 707 566 681 802 789 709 689 803 304 245 567 359 590 349 648 190 406
570 216 362 596 191 249 793

TABLE 20b 591 407 420 713 571 834 363 805 410 598 652 312 370 573 365 220 544 422 411 835
721 809 599 612 336 232 371 898 654 602 423 222 837 737 413 316 817 452 426 373
776 660 655 603 614 223 899 128 236 318 841 427 377 454 344 615 605 560 662 319
434 618 901 238 429 780 455 849 663 676 400 348 244 435 619 239 458 905 666 865
626 782 568 360 621 459 437 678 667 350 246 788 192 783 592 627 466 408 351 247
461 441 679 669 572 708 913 364 629 250 467 682 929 790 251 412 482 574 683 633
791 366 469 804 710 600 690 794 575 372 424 224 253 367 483 685 711 414 473 961
691 806 795 656 714 604 415 374 320 485 807 693 797 715 616 428 836 375 606 810
489 722 697 717 240 378 664 607 456 430 811 838 379 436 431 497 723 620 818 813
738 839 725 352 381 668 900 622 819 842 460 248 784 739 438 729 628 623 821 843
680 439 741 902 670 462 442 252 850 671 630 468 463 576 845 825 684 368 792 903
443 631 745 851 906 254 470 416 445 634 753 866 853 712 686 907 255 471 635 484
796 692 687 376 867 474 637 808 914 608 857 716 798 909 486 475 694 869 915 799
432 380 487 477 695 718 930 812 873 490 698 917 724 719 382 624 491 699 931 840
814 440 383 881 921 498 726 701 820 464 493 815 962 672 933 727 499 740 844 963
632 822 730 444 937 501 823 731 742 846 446 472 256 904 965 945 447 505 826 688
636 852 743 847 733 827 746 969 638 854 908 476 829 747 800 639 696 855 977 868
754 488 749 478 910 858 755 720 916 479 993 911 870 859 700 384 492 816 757 871
861 918 702 874 728 761 494 919 703 932 500 875 495 922 824 882 877 732 934 923
502 848 448 883 744 734 935 925 503 828 964 938 885 506 735 640 748 939 830 889
507 856 966 831 946 750 480 509 941 967 912 860 756 751 947 970 872 971 949 862
758 704 978 920 863 496 759 973 953 876 762 979 763 924 994 878 981 504 884 936
736 765 879 995 926 985 927 886 832 997 508 940 887 1001 752 890 968 510 942
891 948 511 943 1009 864 893 972 760 950 951 974 954 764 980 975 880 955 766
982 928 957 767 983 996 888 986 998 987 944 892 999 512 989 1002 894 1003 952
895 1010 976 1005 1011 956 1013 958 984 768 959 1017 988 1000 990 991 896 1004
1006 1012 1007 1014 960 1015 1018 1019 992 1021 1008 1016 1020 1022 1023 1024

The numbers shown in the above Tables 20a and 20b indicate channel indexes, and the channels are arranged in descending order of channels from a good channel to a bad channel according to the channel state.

Meanwhile, when the target block error rate is 1% and a total of code length is 1536, the optimized bit channel index sequence may be shown as in the following Tables 21a and 21b. The following Tables 21a and 21b may be understood in the connected form. In addition, the case in which a total of codes is 1536 may be the case in which the coding is performed the coding is performed with a length 210 having N=1024 using the following Tables 21a and 21b, and the polar codeword coded by a length of N=512 ($2^5$) using the following Table 21a is repeated and additionally transmitted.

Unlike the previous examples to perform the same, in the following Tables 21a and 21b, respectively, are configured so that the number of channel indexes is 512. Accordingly, the case in which a total of codes is 1536 may be the case in which the coding is performed the coding is performed with a length 210 having N=1024 using the following Tables 21a and 21b, and the polar codeword coded by a length of N=512 ($2^5$) using the following Table 21a is repeated and additionally transmitted. In addition, the numbers shown in the above Tables 21a and 21b indicate channel indexes, and the channels are arranged in descending order of channels from a good channel to a bad channel according to the channel state.

TABLE 21a 1 513 257 129 65 33 17 2 3 34 18 5 514 258 130 66 67 35 19 9 515 517 521 259 261
265 131 133 137 69 73 37 41 21 25 4 529 273 145 81 49 6 545 97 7 289 161 20 10 516
260 132 68 36 11 321 262 193 134 70 38 22 13 518 577 519 522 641 523 263 266 385
267 135 138 139 71 74 75 82 39 42 43 50 23 26 27 29 8 530 525 274 269 146 141 147
77 83 45 51 12 769 531 275 290 162 149 98 85 53 14 546 533 277 163 99 89 72 57 40
24 15 547 520 537 578 549 579 524 553 642 581 526 561 532 527 291 264 281 322
293 323 268 297 386 325 270 305 276 387 271 329 136 153 194 165 140 195 169 197
142 177 148 143 201 150 101 76 105 78 113 84 79 86 44 46 52 47 54 55 28 30 31 16
643 585 534 645 548 770 535 593 538 771 649 550 539 609 773 551 580 657 541 554
777 673 582 555 528 562 785 583 557 705 644 586 563 801 536 587 565 646 594 589
647 540 552 278 389 292 279 337 282 393 294 353 283 295 401 324 285 298 417 299
326 272 306 327 301 449 388 330 307 280 331 309 390 338 333 391 313 284 339 394
296 286 164 151 209 154 166 225 155 167 196 157 170 171 198 144 178 199 173 202
179 152 203 181 210 205 185 156 211 168 226 158 100 87 90 102 91 103 93 106 107
80 114 109 115 88 117 92 121 104 94 95 108 58 569 595 650 772 542 354 213 159
172 59 61 48 56 60 62 63 32 610 651 597 543 556 833 774 658 611 653 584 601 558
775 659 897 613 564 778 559 674 661 588 617 779 566 675 786 665 590 781 567 625
648 706 677 596 570 787 591 707 802 571 681 544 789 652 598 709 803 573 612 689
599 793 654 602 834 805 713 776 660 560 614 655 603 835 809 721 615 662 605 780
618 676 663 568 592 341 395 287 300 402 355 397 345 328 302 403 357 308 303 418
405 332 361 310 419 409 334 369 311 392 450 421 314 340 335 451 315 288 425 342
396 453 317 356 343 433 398 346 457 404 304 358 399 347 465 359 406 349 362 420
407 312 481 363 410 336 370 422 316 227 217 200 174 229 180 175 204 233 182 206
183 241 212 186 207 187 160 214 189 228 215 218 176 230 219 231 221 234 184 235
208 242 237 188

TABLE 21b

```
243 110 666 619 898 837 782 411 365 216 190 116 572 626 678 817 788 371 423 245
111 667 621 783 452 344 318 413 426 191 118 119 122 123 96 125 112 120 124 126
127 64 737 899 679 600 627 841 574 708 669 790 682 901 575 629 804 656 849 683
791 710 604 794 690 633 616 905 711 685 806 865 606 714 795 691 664 807 913 836
607 620 715 797 810 693 722 929 668 717 811 838 622 697 784 723 680 818 628 839
623 813 670 738 961 900 842 725 819 576 630 671 684 792 739 843 729 821 902 631
850 741 712 634 686 845 903 825 796 692 851 906 635 687 745 608 808 866 716 798
853 907 637 694 753 867 914 799 695 812 718 857 909 698 724 915 624 869 719 840
814 699 930 917 672 726 820 815 632 373 319 427 400 454 348 434 377 360 455 429
350 458 435 408 351 459 364 437 466 412 461 366 441 467 424 372 367 414 482 469
320 374 415 428 483 473 375 456 485 378 430 436 431 379 352 489 460 438 381 497
462 439 442 468 463 443 416 470 445 376 484 471 474 220 701 844 873 740 727
249 822 486 432 475 380 232 931 730 487 222 921 688 846 823 742 636 881 904 731
826 852 477 490 382 223 440 236 238 244 239 192 246 247 250 251 224 253 240 248
252 254 255 128 962 933 847 743 638 733 800 827 746 696 963 908 854 937 639 720
747 829 868 855 965 910 754 858 700 945 749 916 816 870 911 969 755 859 728 702
871 918 861 757 874 977 703 824 932 919 732 875 761 922 848 744 993 882 934 828
734 923 877 883 935 640 735 964 748 925 856 830 938 885 831 939 966 750 912 860
889 946 756 967 751 941 872 970 947 862 704 758 920 971 863 949 876 759 978 762
973 953 924 979 878 763 936 736 884 994 879 926 981 765 832 995 886 927 940 985
887 997 752 968 890 942 948 1001 891 943 864 383 491 972 760 893 950 464 498
1009 444 493 974 951 499 764 954 980 880 975 472 446 501 955 928 447 476 505
488 478 479 492 384 494 500 495 448 502 503 506 507 480 509 496 504 508 510 511
256 766 982 888 957 996 767 983 986 944 998 892 987 999 989 894 1002 952 895
1003 976 1010 956 1005 1011 984 958 768 1013 959 988 1017 1000 990 991 1004
896 1006 1012 1007 960 1014 1015 1018 1019 992 1021 1008 1016 1020 1022 1023
512 1024
```

Figure 7:
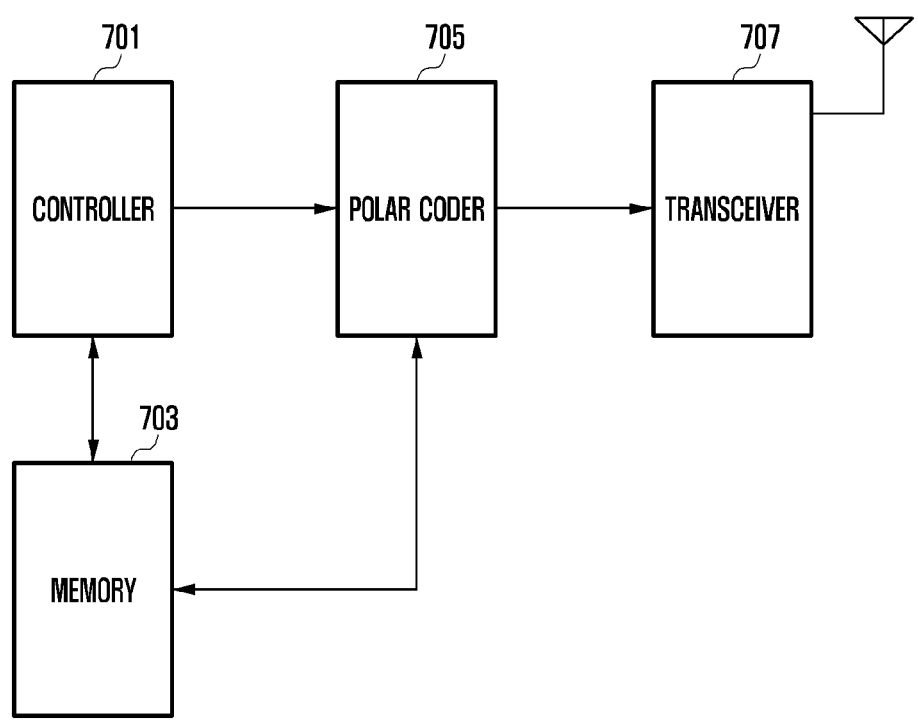
FIG. 7 illustrates a conceptual block diagram of a transmitting apparatus for applying the polar coding scheme according to the present disclosure.

FIG. 7 illustrates a conceptual block diagram of a transmitting apparatus for applying the polar coding scheme according to the present disclosure.

Hereinafter, a transmitting apparatus for applying the polar coding scheme according to the present disclosure may be described with reference to FIG. 7. It may be noted that FIG. 7 shows only the configuration necessary for explaining the present disclosure. The apparatus configuration of FIG. 7 that transmits data in the polar code manner may be applied to the base station or may be applied to the terminal apparatus. Therefore, if the configuration of the apparatus according to the present disclosure is applied to the terminal apparatus, various additional elements for convenience of the user may be further included. Further, if the configuration of the apparatus according to the present disclosure is applied to a base station, elements necessary for the base station may be further provided, and may be configured in a more complex form. However, in the following description, only the minimum configuration necessary for transmitting data by applying the present disclosure is illustrated so as not to obscure the gist of the present disclosure.

According to the present disclosure, the controller 701 may determine the code rate depending on the error rate required for data to be transmitted and determine the size of data to be transmitted. The controller 701 may perform various controls necessary for data transmission as described above. In addition, the controller 701 may determine which sequence of the optimized bit channel index sequences generated according to the present disclosure is to be used in the memory 703. Accordingly, the controller 701 may perform a control to read the sequence from the memory 703 or output a specific sequence among the sequences stored in the memory 703 to a polar coder 705. In addition, the controller 701 may provide the data to be transmitted to the polar coder 705. When the controller 701 is located in the terminal, the controller 701 may be a communication processor or an application processor or one processor in which the communication processor and the application processor are integrated, and may be configured using a specific control logic. In addition, when the controller 701 is located in the base station, the controller 701 may be the control processor included in a scheduler or the base station, or may be configured using the specific control logic.

The memory 703 may store the optimized bit channel index sequences of the type described above. For example, the case in which one index that can be applied to all lengths is stored depending on the respective required error rates, that is, a code rate, and indexes corresponding to the respective required error rates, that is, the code rates may be provided.

Therefore, when one index which can be applied to all the lengths is stored depending on the respective required error rate, that is, the code rate, the memory 703 stores the above-mentioned Tables 18a, 18b, 19a, 19b, 20a, and 20b. On the other hand, the case in which the respected required error rates, that is, the code rates, as well as the different sequences applicable to the length are requested, the tables of the above Tables 1 to 17b may be stored. In addition, the above Tables 21a and 21b for length 1536 may be further stored.

The polar coder 705 may encode and output data using the data provided from the controller 701 and the sequences of the table stored in the memory 703 under the control of the controller 701. The transmitter/receiver 707 may perform the processing for transmitting data in the system to transmit data in a desired manner, for example, according to a specific wireless communication scheme or a wired communication scheme. FIG. 7 illustrates a case in which the present disclosure is applied to a wireless communication system, and it is possible to transmit polar-coded data by performing band up conversion and power amplification of a signal in a frequency band set in the wireless communication system.

Figure 8:
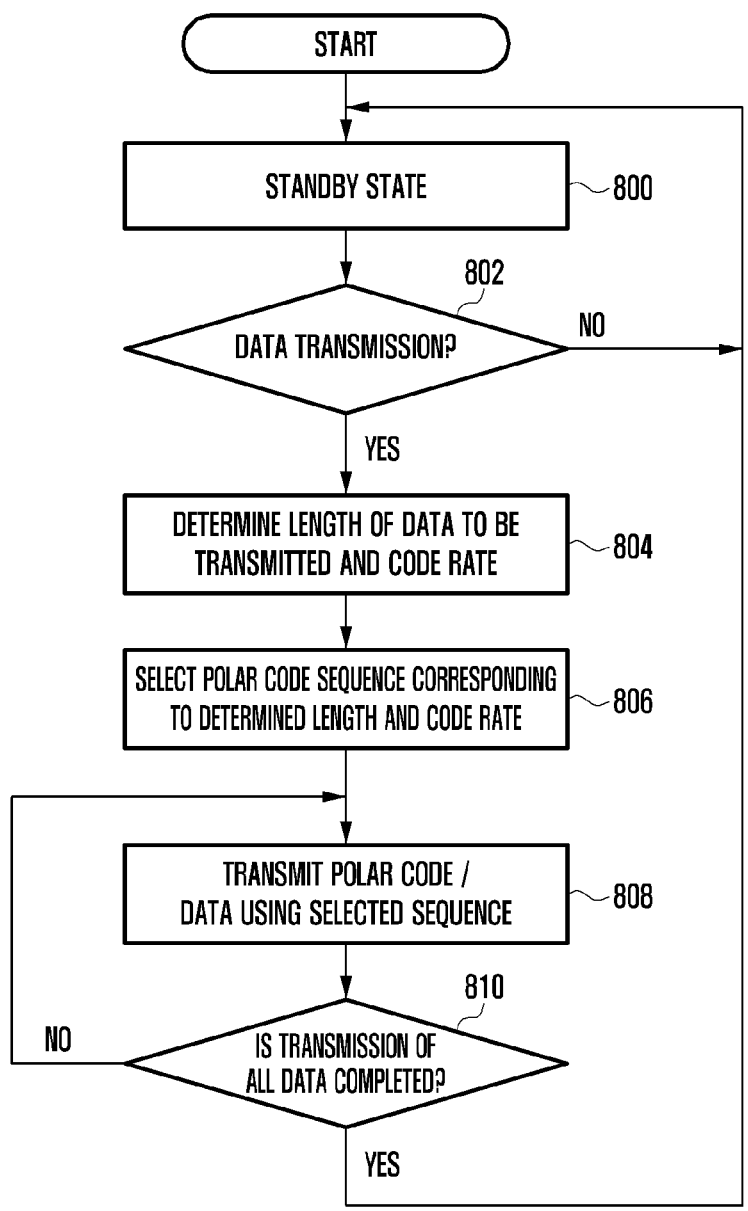
FIG. 8 illustrates a control flowchart for performing polar coding at the time of data transmission in a transmitting apparatus according to an embodiment of the present disclosure.

FIG. 8 illustrates a control flowchart for performing polar coding at the time of data transmission in a transmitting apparatus according to an embodiment of the present disclosure.

The controller 701 maintains a standby state in step 800. Here, the standby state may be a state in which a specific operation is not required and only a basic monitoring operation of the terminal or the base station is performed. Thereafter, the controller 701 proceeds to step 804 when the data transmission is requested in step 802, and maintains step 800 when the data transmission is not required.

When the controller 701 requests the data transmission and proceeds to step 804, the controller 701 determines a length and a code rate of data to be transmitted. At this time, the length of the data to be transmitted and the code rate may consider various factors such as the channel state and the transmit power to the receiving side. Here, the operation for determining the length and the code rate of data is not particularly limited since it is possible to use either the known method or a method to be used in the future.

If the length of the data to be transmitted and the code rate are determined, the controller 701 proceeds to step 806 and may select the polar code sequence stored in the memory 703. At this time, it is possible to distinguish the case where different polar code sequences are stored for each length in the memory 703 and the case in which one sequence applicable to all the lengths is stored.

First, the case in which different polar code sequences for each length is stored in the memory 703 may be described. Assume the case in which the data to be transmitted has a very short length, for example, a length of 10, as a specific control signal. In this case, there is actually no matched length in the table as described above. Therefore, in this case, the controller 701 may select the lowest length having the target error rate like a length of 32 or 64 which is the shortest length. If the length has a length exceeding 32, such as 40, the sequence having a length 32 cannot be used, so that the controller 701 selects a sequence having a length of 64.

On the other hand, as described above, when only the longest sequences are stored in the memory 703, the controller 701 may select a sequence depending on the corresponding target error rate among the longest sequences.

If a specific sequence is selected in step 806, the controller 701 proceeds to step 808 and may control the polar coder 705 to perform the polar code using the selected sequence. In addition, the controller 701 controls the transceiver 707 to transmit the data polar-coded in the polar coder 705 to the receiving side.

Next, in step 810, the controller 701 determines whether the transmission of all data to be transmitted is completed. If the transmission of all the data is not completed, the controller 701 proceeds to step 808 to continuously perform the polar coding and data transmission operations. On the other hand, when the transmission of all the data is completed, the controller 701 proceeds to step 800 to maintain the standby state.

Next, in the case of applying the polar coding scheme of the present disclosure, the results of the error rate performance may be described.

Figure 9A:
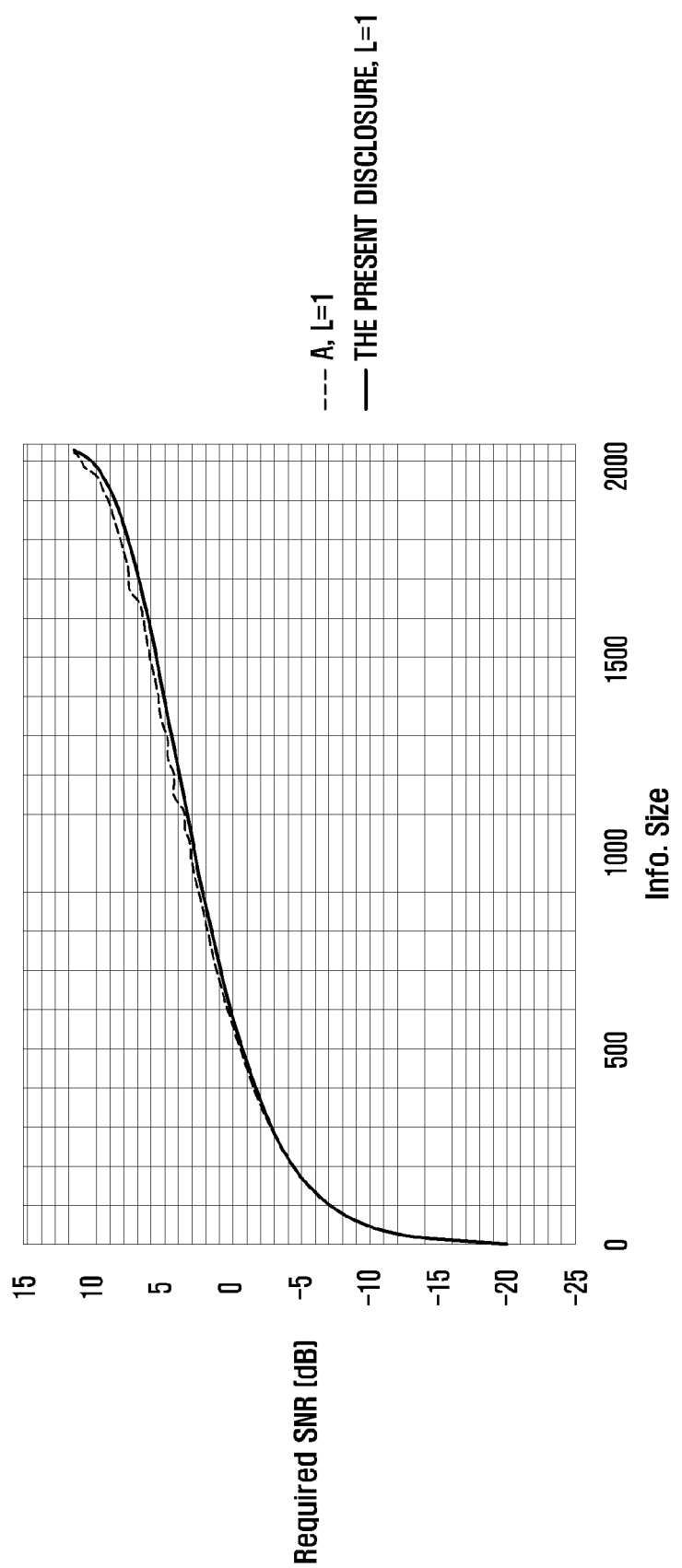
FIGS. 9A and 9B illustrate graphs of a comparison simulation between a case of applying a polar coding scheme of the present disclosure and a case of using a polar coding scheme having a simple polynomial described prior to describing the present disclosure.
Figure 9B:
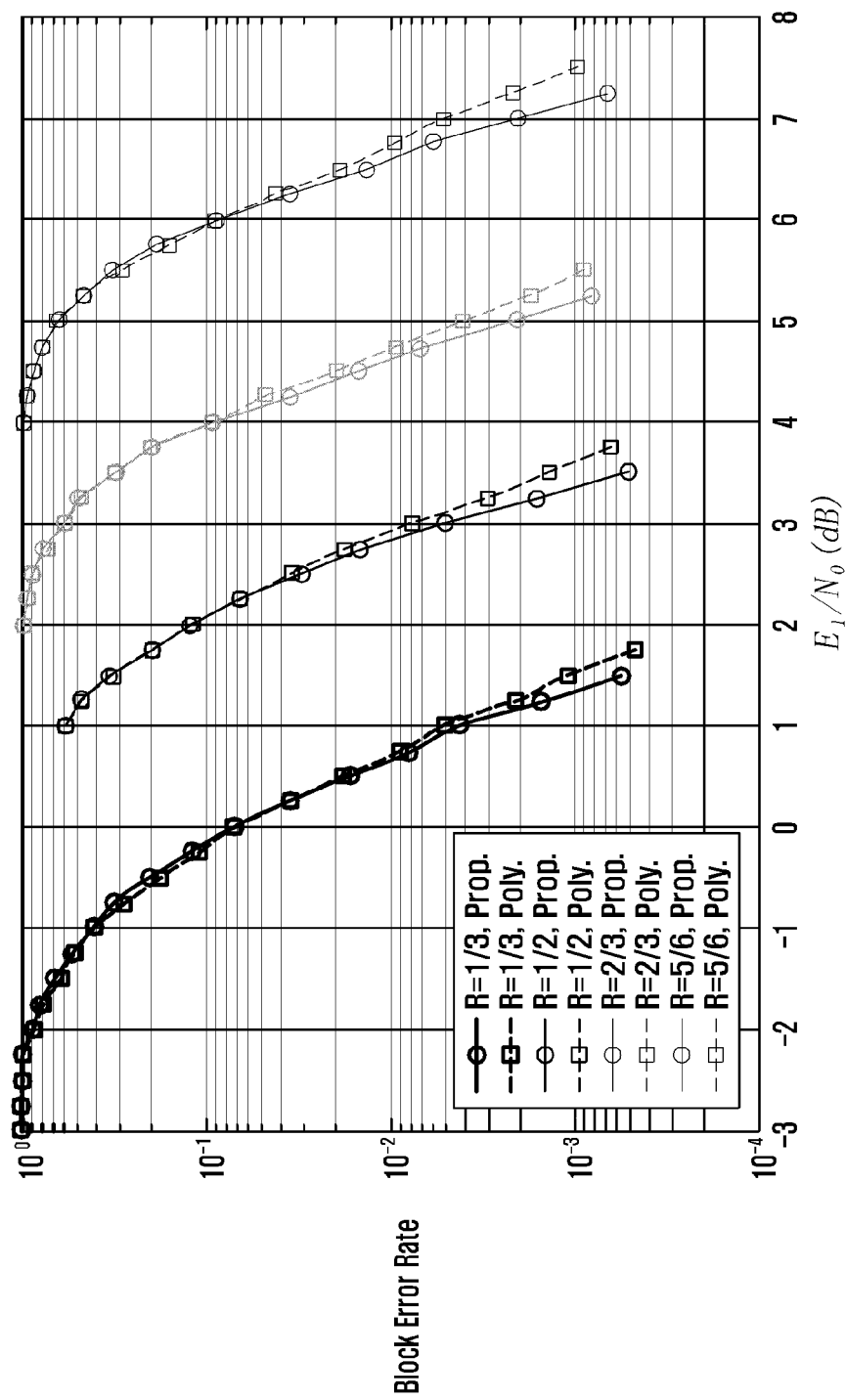

FIGS. 9A and 9B illustrate graphs of a comparison simulation between a case of applying a polar coding scheme of the present disclosure and a case of using a polar coding scheme having a simple polynomial described prior to describing the present disclosure.

First, in FIG. 9A, the SNR performance required for achieving a block error rate (BLER) of 0.1% is compared with the change in the number of information bits with respect to a code length N=2048. In FIG. 9A, one indicated by 'A' is the case of the polar coding scheme having the simple polynomial described prior to describing the present disclosure. Comparing the case in which the sequence according to the present disclosure is applied with A, since the SNR of the existing scheme is similar to or lower than that of the scheme of the present disclosure in the whole area, it can be confirmed that the sequence of the present disclosure has better performance.

Next, FIG. 9B illustrates a comparison between the block error performances depending on various code rates for N=512. A portion indicated by a solid line for each code rate is the performance of the inventive sequence, and a portion indicated by a dotted line is the case of the polar coding method having a simple polynomial. As can be seen from the graph of FIG. 9B, it can be seen that the sequence of the present disclosure has better performance based on the BLER of 0.1% than the sequence of the related art.

Further, another embodiment of the present disclosure may be described in detail with reference to the following Table 22. When a target block error rate is 2% and the code length is 64, the optimized bit channel index sequence may be shown as in the following Table 22. Also, the numbers illustrated in the following Table 22 are values indicating the bit index of the polar code, and follow a method for indicating the smallest bit index from 1. The following sequence is recorded in order from the bad channel to the good channel depending on the channel state. A sequence having a length of N=64 arranged in the following Table 22 is used for encoding and decoding of a polar code having a code size of 64, and may be used as a subset of polar code sequences having lengths longer than 64, for example, sequences having lengths of N=128, 256, 512, 1024. That is, the order of numbers 1 to 64 on a long sequence may follow the order of the following Table 22.

TABLE 22

1 2 3 5 9 17 33 4 6 7 10 11 18 13 19 34 21 25 35 8 37 12
41 14 20 15 49 22 23 36 26 38 27 42 39 29 43 16 45 50
24 51 53 28 40 57 30 31 44 46 52 47 54 55 58 59 32 61 48
56 60 62 63 64

Further, another embodiment of the present disclosure may be described in detail with reference to the following Table 23. When a target block error rate is 5% and the code length is 128, the optimized bit channel index sequence may be shown as in the following Table 23. Also, the numbers illustrated in the following Table 23 are values indicating the bit index of the polar code, and follow a method for indicating the smallest bit index from 1. The following sequence is recorded in order from the bad channel to the good channel depending on the channel state. A sequence having a length of N=128 arranged in the following Table 23 is used for encoding and decoding of a polar code having a code size of 128, and may be used as a subset of polar code sequences having lengths longer than 64, for example, sequences having lengths of N=256, 512, 1024. In addition, the values from 1 to 64 among the sequences of N=128 in the following Table 23 may be used as a subset of the longer sequences. In addition, the values from 65 to 128 among the sequences of N=128 in the following Table 23 may be used as a subset of the longer sequences. That is, the order of numbers 1 to 128 on a long sequence may follow the order of the following Table 22.

TABLE 23

1 2 3 5 9 17 33 4 6 65 7 10 11 18 13 19 34 21 35 25 8 37 66
41 12 67 69 14 20 49 15 73 22 36 23 26 38 81 97 27 68 39
42 29 43 70 16 50 45 71 74 51 24 75 53 82 28 77 57
40 83 30 98 85 31 44 99 46 72 89 52 101 47 76
105 54 55 78 84 58 113 79 86 59 32 100 87 61 90 102 48 91
103 93 56 106 107 80 60 114 109 88 115 62 63 117 92 104

TABLE 23-continued 121 94 95 108 110 116 111 64 118 119 122 96 123 125
112 120 124 126 127 128

Further, another embodiment of the present disclosure may be described in detail with reference to the following Table 24. When the target block error rate is 4% and the code length is 128, the optimized bit channel index sequence may be shown as in the following Table 24. Also, the numbers illustrated in the following Table 24 are values indicating the bit index of the polar code, and follow a method for indicating the smallest bit index from 1. The following sequence is recorded in order from the bad channel to the good channel depending on the channel state. A sequence having a length of N=128 arranged in the following Table 24 is used for encoding and decoding of a polar code having a code size of 128, and may be used as a subset of polar code sequences having lengths longer than 64, for example, sequences having lengths of N=256, 512, 1024. In addition, the values from 1 to 64 among the sequences of N=128 in the following Table 23 may be used as a subset of the longer sequences. In addition, the values from 65 to 128 among the sequences of N=128 in the following Table 23 may be used as a subset of the longer sequences. That is, the order of numbers 1 to 128 on a long sequence may follow the order of the following Table 22.

TABLE 24

1 2 3 5 9 17 33 4 6 65 7 10 11 18 13 19 34 21 35 25 8 37
66 41 12 67 69 14 20 49 15 73 22 36 23 26 38 81
27 68 39 42 29 97 43 70 16 50 45 71 74 51 24 75 53
82 28 77 57 40 83 30 98 85 31 44 99 46 72 89 52 101 47
76 105 54 55 78 84 58 113 79 86 59 32 100 87 61 90 102
48 91 103 93 56 106 107 80 60 114 109 88 115 62
63 117 92 104 121 94 95 108 110 116
111 64 118 119 122 96 123 125 112 120 124 126 127 128

Further, another embodiment of the present disclosure may be described in detail with reference to the following Table 25. When the target block error rate is 5% and the code length is 256, the optimized bit channel index sequence may be shown as in the following Table 25. Also, the numbers illustrated in the following Table 25 are values indicating the bit index of the polar code, and follow a method for indicating the smallest bit index from 1. The sequence of the following Table 25 is recorded in order from the bad channel to the good channel depending on the polarized sub-channel state. A sequence having a length of N=256 arranged in the following Table 25 is used for encoding and decoding of a polar code having a code size of 256, and may be used as a subset of polar code sequences having lengths longer than 256, for example, sequences having lengths of N=512, 1024. In addition, sequences from 129 to 256 among the sequences of N=256 in the following Table 25 may be used as a subset of the longer sequences. That is, according to the present embodiment, the order of numbers 129 to 256 on a sequence having a length longer than 256 may follow the order of the following Table 25.

TABLE 25

1 2 3 5 9 17 33 4 6 65 129 7 10 11 18 13 19 34 21 35 25 66 8
37 67 41 12 130 69 14 20 73 49 131 15 133 22 36 23 81 26
38 27 39 68 137 97 42 29 145 70 43 16 71 50 45 132 161 74
51 193 24 75 53 134 82 28 77 135 57 83 138 40 30 98
139 85 146 31 44 99 72 141 46 89 147 52 101 162 149
47 76 54 105 163 78 194 153 55 84 58 136 79 113 165 195
59 86 87 32 140 169 100 197 90 102 61 148 142 143 91 103
177 48 201 150 106 93 164 151 209 107 56 154 80 166 114
225 60 109 155 115 167 196 170 157 88 62 117 171 198
144 63 92 178 199 104 121 173 202 179 94 152
203 108 95 181 210 205 156 110 211 168 116 185 158
111 226 213 118 172 159 64 227 119 200 174 217
122 180 229 175 204 123 96 233 182 206 125 183
212 186 207 112 241 214 187 160 228 215 120 189
218 230 176 219 124 231 234 221 126 184 235
127 208 242 188 237 243 216 190 245 191 220 249 232
222 223 128 236 238 244 239 192 246 247 250 251
224 253 240 248 252 254 255 256

Further, another embodiment of the present disclosure may be described in detail with reference to the following Table 26. When the target block error rate is 2% and the code length is 128, the optimized bit channel index sequence may be shown as in the following Table 26. Also, the numbers illustrated in the following Table 26 are values indicating the bit index of the polar code, and follow a method for indicating the smallest bit index from 1. The sequence of the following Table 26 is recorded in order from the bad channel to the good channel depending on the polarized sub-channel state. A sequence having a length of N=128 arranged in the following Table 26 is used for encoding and decoding of a polar code having a code size of 128, and may be used as a subset of polar code sequences having lengths longer than 128, for example, sequences having lengths of N=256, 512, 1024. In addition, sequences from 65 to 128 among the sequences of N=128 in the following Table 26 may be used as a subset of the longer sequences. That is, according to the present embodiment, the order of numbers 65 to 128 on a sequence having a length longer than 128 may follow the order of the following Table 26.

TABLE 26

1 2 3 5 9 17 33 4 6 65 7 10 11 18 13 19 34 21 35 25 8 66
37 12 67 41 14 20 69 49 15 73 22 36 23 81 26 38 27 39
68 42 97 29 70 43 16 50 71 45 74 24 51 75 53 82 28 77 40
83 30 57 98 85 44 31 99 72 46 89 52 101 47 76 54 105 78
55 84 58 113 79 86 59 32 100 87 61 90 102 48 91
103 93 106 56 107 80 114 60 109 115 88 62 117 63 92
104 121 94 108 95 110 116 111 64 118 119 122 96 123
125 112 120 124 126 127 128

Further, another embodiment of the present disclosure may be described in detail with reference to the following Table 27. When the target block error rate is 3% and the code length is 128, the optimized bit channel index sequence may be shown as in the following Table 27. Also, the numbers illustrated in the following Table 27 are values indicating the bit index of the polar code, and follow a method for indicating the smallest bit index from 1. The sequence of the following Table 27 is recorded in order from the bad channel to the good channel depending on the polarized sub-channel state. A sequence having a length of N=128 arranged in the following Table 27 is used for encoding and decoding of a polar code having a code size of 128, and may be used as a subset of polar code sequences having lengths longer than 128, for example, sequences having lengths of N=256, 512, 1024. In addition, sequences from 65 to 128 among the sequences of N=128 in the following Table 27 may be used as a subset of the longer sequences. That is, according to the present embodiment, the order of numbers 65 to 128 on a sequence having a length longer than 128 may follow the order of the following Table 27.

TABLE 27

1 2 3 5 9 17 33 4 6 65 7 10 11 18 13 19 34 21 35 25 37 8
66 41 67 12 14 69 20 49 15 73 22 36 23 81 26 38 27
97 39 68 42 29 70 43 50 16 71 45 74 51 24 75 53
82 28 77 40 83 57 30 98 85 44 31 99 72 46 89 52 101 47 76
54 105 78 55 84 58 113 79 86 59 32 100 87 61 90 102 48
91 103 106 93 56 107 80 114 60 109 115 88 62 117 63
92 104 121 94 108 95 110 116 111 64 118 119 122 96 123
125 112 120 124 126 127 128

Further, another embodiment of the present disclosure may be described in detail with reference to the following Table 28. When the target block error rate is 2% and the code length is 256, the optimized bit channel index sequence may be shown as in the following Table 28. Also, the numbers illustrated in the following Table 28 are values indicating the bit index of the polar code, and follow a method for indicating the smallest bit index from 0. The sequence of the following Table 28 is recorded in order from the bad channel to the good channel depending on the polarized sub-channel state. A sequence having a length of N=256 arranged in the following Table 28 is used for encoding and decoding of a polar code having a code size of 256, and may be used as a subset of polar code sequences having lengths longer than 256, for example, sequences having lengths of N=512, 1024. That is, according to the present embodiment, the order of numbers 0 to 256 on a sequence having a length longer than 255 may follow the order of the following Table 28. In addition, sequences from 128 to 255 among the sequences of N=256 in the following Table 28 may be used as a subset of the longer sequences. That is, according to the present embodiment, the order of numbers 128 to 256 on a sequence having a length longer than 256 may follow the order of the following Table 28.

TABLE 28

0 1 2 4 8 16 32 3 5 6 64 128 9 10 17 12 18 33 20 34 65 24 36
7 40 11 66 129 13 19 68 48 130 14 21 72 132 35 22 25 37 80
136 26 38 67 41 96 144 28 69 42 49 15 70 44 73 131 50 23
74 160 52 133 192 81 76 134 27 39 82 56 137 97 29 138 84
145 43 30 98 71 140 45 88 146 51 100 161 148 46
75 53 104 162 152 77 54 83 57 112 193 164 135 194 78
168 85 58 86 31 139 60 141 99 89 196 147 101 176 200 90
102 105 47 142 149 208 92 163 150 106 55 224 153 165
113 79 108 154 59 114 166 195 156 169 87 61 116 170 197
143 62 91 177 198 103 120 172 201 178 93 151 202 107
94 180 209 155 204 109 210 167 115 184 225 110 157
212 117 158 226 63 171 216 118 199 173 121 228 179
174 203 122 95 232 181 205 124 182 211 185 240 111 206
213 186 159 227 214 188 119 217 218 230 229 175 123 220
233 125 183 234 207 126 241 187 236 242 215 189 244 190
219 248 231 221 222 127 235 237 243 238 191 245 246
249 250 223 252 239 247 251 253 254 255

Further, another embodiment of the present disclosure may be described in detail with reference to the following Table 29. When the target block error rate is 1.5% and the code length is 256, the optimized bit channel index sequence may be shown as in the following Table 29. Also, the numbers illustrated in the following Table 29 are values indicating the bit index of the polar code, and follow a method for indicating the smallest bit index from 0. The sequence of the following Table 29 is recorded in order from the bad channel to the good channel depending on the polarized sub-channel state. A sequence having a length of N=256 arranged in the following Table 29 is used for encoding and decoding of a polar code having a code size of 256, and may be used as a subset of polar code sequences having lengths longer than 256, for example, sequences having lengths of N=512, 1024. That is, according to the present embodiment, the order of numbers 0 to 255 on a sequence having a length longer than 256 may follow the order of the following Table 29. In addition, sequences from 128 to 255 among the sequences of N=256 in the following Table 29 may be used as a subset of the longer sequences. That is, according to the present embodiment, the order of numbers 128 to 255 on a sequence having a length longer than 256 may follow the order of the following Table 29.

TABLE 29

0 1 2 4 8 16 32 3 5 6 64 128 9 10 17 12 18 33 20 34 65 24 36
7 40 11 66 129 13 19 68 48 130 14 21 72 132 35 22 25
37 80 136 26 38 67 41 96 144 28 69 42 49 15 70 44 73
131 50 23 74 160 52 133 192 81 76 134 27 39 82
56 97 137 138 29 84 145 43 140 30 98 71 45 88 161 51
100 146 148 46 75 53 104 152 162 77 193 54 83 194 57
112 78 135 85 164 58 139 86 31 60 99 168 141 196 89 101
147 90 176 102 142 200 149 105 47 92 163
208 106 153 55 113 165 150 166 169 79 108 59 195 154
114 224 156 87 170 61 197 116 62 91 177 103 120 201
172 178 198 143 202 93 180 107151 209 94 204 155 109 184
210 115 167 225 110 157 212 171 117 226 158 63 118 216
179 121 199 173 228 174 122 203 181 232 205 182 211
95 124 185 206 240 213 186 111 214 227 188 217 119
229 159 218 233 175 230 123 220 183 234 125 207 126
241 187 236 242 215 189 244 190 219 231 248 221 235 222
127 237 243 238 245 191 246 249 250 223 252
239 247 251 253 254 255

Further, another embodiment of the present disclosure may be described in detail with reference to the following Table 30. When the target block error rate is 7% and the code length is 512, the optimized bit channel index sequence may be shown as in the following Table 30. Also, the numbers illustrated in the following Table 30 are values indicating the bit index of the polar code, and follow a method for indicating the smallest bit index from 0. The sequence of the following Table 30 is recorded in order from the bad channel to the good channel depending on the polarized sub-channel state. A sequence having a length of N=512 arranged in the following Table 30 is used for encoding and decoding of a polar code having a code size of 512, and may be used as a subset of polar code sequences having lengths longer than 512, for example, sequences having lengths of N=1024, 2048. That is, according to the present embodiment, the order of numbers 0 to 511 on a sequence having a length longer than 512 may follow the order of the following Table 30. In addition, sequences from 256 to 511 among the sequences of N=512 in the following Table 30 may be used as a subset of the longer sequences. That is, according to the present embodiment, the order of numbers 256 to 511 on a sequence having a length longer than 512 may follow the order of the following Table 30.

TABLE 30

0 1 2 4 8 16 32 3 5 64 6 9 10 17 12 18 128 256 33 20 34 24 65 7 36 66 40 11 68 13 19 72 129 48
14 21 130 257 35 22 80 25 132 258 37 26 38 67 136 96 260 41 28 69 42 144 264 15 70 49 44 73
131 50 23 74 160 272 133 52 81 27 76 134 56 82 137 192 288 320 259 39 29 97 384 138 84 261
30 43 145 98 71 140 45 88 262 146 51 100 265 46 75 161 148 53 104 266 77 162 273 135 54 83

TABLE 30-continued 152 57 78 164 193 112 268 274 139 58 85 86 31 194 289 99 168 276 141 89 101 60 147 196
290 142 90 102 47 176 280 321 292 149 200 263 322 296 105 92 163 150 153 106 165 208 385
324 267 304 55 79 113 154 59 108 166 195 269 114 169 87 156 224 386 328 275 270 388 277
61 197 170 116 392 352 291 278 143 62 91 177 198 336 103 172 201 120 281 400 293 282 93
178 294 416 323 151 202 284 107 94 180 297 209 155 204 109 167 210 115 184 298 325 448
305 271 300 326 157 110 225 387 212 329 306 171 117 158 226 63 330 199 118 173 216 279
308 389 337 121 179 228 332 312 390 338 283 393 174 122 181 232 203 95 295 353 340 394
285 205 124 182 211 185 206 240 354 401 286 344 299 396 402 356 111 327 301 213 186 417
404 159 307 302 227 214 188 119 360 418 331 309 217 333 310 408 449 420 368 218 230 233
229 123 183 220 125 234 175 391 313 339 450 314 334 395 341 355 207 241 424 342 397 432
236 316 357 287 187 345 398 403 452 361 126 242 456 215 405 346 189 244 409 358 303 362
464 419 406 190 348 219 311 369 421 231 248 480 335 410 425 370 315 221 422 364 235 317
451 343 412 222 433 453 372 127 237 426 243 454 347 376 238 428 457 318 359 465 245 349
434 399 436 191 363 246 407 458 365 371 249 411 460 466 350 440 423 366 250 481 413 482
427 373 468 223 252 414 377 472 374 429 435 455 378 239 430 459 319 437 484 380 488 247
461 467 351 441 469 438 496 442 367 462 251 444 483 415 473 253 470 375 254 485 431 474
379 486 489 476 381 439 490 463 382 497 443 492 498 471 445 255 500 446 475 487 504 477
491 478 383 493 499 494 501 447 502 505 506 479 508 495 503 507 509 510 511

Further, another embodiment of the present disclosure may be described in detail with reference to the following Table 31. When the target block error rate is 4% and the code length is 512, the optimized bit channel index sequence may be shown as in the following Table 31. Also, the numbers illustrated in the following Table 30 are values indicating the bit index of the polar code, and follow a method for indicating the smallest bit index from 0. The sequence of the following Table 31 is recorded in order from the bad channel to the good channel depending on the polarized sub-channel state. A sequence having a length of N=512 arranged in the following Table 31 is used for encoding and decoding of a polar code having a code size of 512, and may be used as a subset of polar code sequences having lengths longer than 512, for example, sequences having lengths of N=1024, 2048. That is, according to the present embodiment, the order of numbers 0 to 511 on a sequence having a length longer than 512 may follow the order of the following Table 31. In addition, sequences from 256 to 511 among the sequences of N=512 in the following Table 31 may be used as a subset of the longer sequences. That is, according to the present embodiment, the order of numbers 256 to 511 on a sequence having a length longer than 512 may follow the order of the following Table 31.

Meanwhile, the embodiments of the present disclosure disclosed in the present specification and the accompanying drawings have been provided only as specific examples in order to assist in understanding the present disclosure and do not limit the scope of the present disclosure. Therefore, it is to be understood that in addition to the exemplary embodiments of the present disclosure described herein, all the changed or modified forms derived from the technical spirit of the present disclosure are included in the scope of the present disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. A method for transmitting data using a polar code, the method comprising:
generating a single polar code sequence for transmitting the data;
coding the data using the generated single polar code sequence; and
transmitting the polar-coded data,

TABLE 31

0 1 2 4 8 16 32 3 5 64 6 9 10 17 12 18 128 256 33 20 34 24 65 7 36 66 40 11 68 13 19 72 129 48
14 21 130 257 35 22 80 25 132 258 37 26 38 67 136 96 260 41 28 69 42 144 264 15 70 49 44 73
131 50 23 74 160 272 133 52 81 27 76 134 56 82 137 192 288 320 259 39 29 97 384 138 84 261
30 43 145 98 71 140 45 88 262 146 51 100 265 46 75 161 148 53 104 266 77 162 273 135 54 83
152 57 78 164 193 112 268 274 139 58 85 86 31 194 289 99 168 276 141 89 101 60 147 196
290 142 90 102 47 176 280 321 292 149 200 263 322 296 105 92 163 150 153 106 165 208 385
324 267 304 55 79 113 154 59 108 166 195 269 114 169 87 156 224 386 328 275 270 388 277
61 197 170 116 392 352 291 278 143 62 91 177 198 336 103 172 201 120 281 400 293 282 93
178 294 416 323 151 202 284 107 94 180 297 209 155 204 109 167 210 115 184 298 325 448
305 271 300 326 157 110 225 387 212 329 306 171 117 158 226 63 330 199 118 173 216 279
308 389 337 121 179 228 332 312 390 338 283 393 174 122 181 232 203 95 295 353 340 394
285 205 124 182 211 185 206 240 354 401 286 344 299 396 402 356 111 327 301 213 186 417
404 159 307 302 227 214 188 119 360 418 331 309 217 333 310 408 449 420 368 218 230 233
229 123 183 220 125 234 175 313 339 391 450 314 334 395 341 355 207 241 424 342 397 432
236 316 357 287 187 345 398 403 452 361 126 242 456 215 405 346 189 244 409 358 303 362
464 419 406 190 348 219 311 369 421 231 248 480 335 410 425 370 315 221 422 364 235 317
451 343 412 222 433 453 372 127 237 426 243 454 347 376 238 428 457 318 359 465 245 349
434 399 436 191 363 246 407 458 365 371 249 411 460 466 350 440 423 366 250 481 413 482
427 373 468 223 252 414 377 472 374 429 435 455 378 239 430 459 319 437 484 380 488 247
461 467 351 441 469 438 496 442 367 462 251 444 483 415 473 253 470 375 254 485 431 474
379 486 489 476 381 439 490 463 382 497 443 492 498 471 445 255 500 446 475 487 504 477
491 478 383 493 499 494 501 447 502 505 506 479 508 495 503 507 509 510 511 wherein generating the single polar code sequence includes:
  calculating an error rate for each polarized sub-channel available in a communication system corresponding to each code rate;
  aligning each polarized sub-channel in order from a channel having a low error rate to a polarized sub-channel having a high error rate based on the error rate of the available polarized sub-channels for each code rate;
  generating channel index sequences assigning an index to the polarized sub-channels aligned for each code rate; and
  generating the single polar code sequence using the channel index sequence generated for each code rate, and,
  wherein, the single polar code sequence is generated by:
    sequentially inserting a channel index sequence having a lowest code rate among the each code rates into the single polar code sequence,
    when a remaining region is present in the single polar code sequence, selecting the channel index sequence having the lowest code rate among remaining code rates, and
    sequentially aligning subsequent channel index sequences in the selected channel index sequence.

2. The method of claim 1, wherein the single polar code sequence has different channel indexes based on a target error rate required for the same code rate.

3. The method of claim 1, further comprising:
  calculating a penalty $W_j$ indicating a degradation in code performance of each code rate for each channel index sequence when the required number of code rates is larger than a predetermined number;
  realigning the channel index sequence having a smallest penalty value for each channel index sequence; and
  generating the single polar code sequence using the realigned channel sequence,
  wherein $W_j$ is calculated by $$W_j = \Sigma_i \alpha_i \{P_i(E_j) - P_i(E_{worst})\}^+$$

where $P_i(E_j)$ is an error rate of an index j in a channel index sequence $S_i$, $P_i(E_{worst})$ has a lowest error value for indexes belonging to an intersection of a set of indexes not included in the single polar code sequence and a set of a channel index sequence $A_i$ having a specific code rate, $\alpha_i$ is a parameter reflecting importance according to the code rate, and an operation of "$\{\cdot\}+$" is an operator which outputs a value in $\{\ \}$ as it is when the value in $\{\ \}$ is positive and outputs value in $\{\ \}$ as 0 when the value in $\{\ \}$ is negative.

4. The method of claim 1, further comprising:
  calculating a penalty $W_j$ indicating a degradation in code performance of each code rate for each channel index sequence when the required number of code rates is larger than a predetermined number;
  realigning the channel index sequence having a smallest penalty value for each channel index sequence; and
  generating the single polar code sequence using the realigned channel sequence,
  wherein $W_j$ is calculated by $$(W_j = \max \{P_i(E_j) - P_i(E_{worst})\}$$

where $P_i(E_j)$ is an error rate of an index j in a channel index sequence $S_i$, and $P_i(E_{worst})$ has a lowest error value for indexes belonging to an intersection of a set of indexes not included in the single polar code sequence and a set of a channel index sequence $A_i$ having a specific code rate.

5. The method of claim 1, further comprising:
  determining a length of data to be transmitted, a data rate of a polar code, and a target error rate when a predetermined data transmission is requested;
  polar-coding the data using the polar code sequence corresponding to the determined length of the data to be transmitted, the code rate of the polar code, and the target error rate; and
  transmitting the polar-coded data.

6. A method for transmitting data using a polar code, the method comprising:
  generating a single polar code sequence for transmitting the data;
  coding the data using the generated single polar code sequence; and
  transmitting the polar-coded data,
  wherein generating the single polar code sequence includes:
    calculating an error rate for each polarized sub-channel available in a communication system corresponding to each code rate;
    aligning each polarized sub-channel in order from a channel having a low error rate to a polarized sub-channel having a high error rate based on the error rate of the available polarized sub-channels for each code rate;
    calculating a penalty $W_j$ indicating a degradation in code performance from a channel index sequence having a lowest code rate among the respective channel index sequences by a predetermined scheme;
    realigning the channel index sequences having the lowest code rate based on the penalty;
    inserting the realigned channel index sequences into the single polar code sequence;
    a first step of selecting a channel index sequence having the lowest code rate among remaining code rates; and
    a second step of realigning remaining channel indexes by calculating the penalty $W_j$ and then sequentially aligning the remaining realigned channel indexes in a region remaining in the single polar code sequence.

7. The method of claim 6, wherein the first step and the second step are repeated until the single polar code sequence is completely filled.

8. The method of claim 6, further comprising:
  extracting indexes from the single polar code sequence in a descending order by a length of data when the data having a shorter length than that of the single polar code sequence is transmitted; and
  performing polar coding using the sequence extracted from the single polar code sequence.

9. The method of claim 6, wherein the penalty $W_j$ is calculated by $$W_j = \Sigma_i \alpha_i \{P_i(E_j) - P_i(E_{worst})\}^+$$

where $P_i(E_j)$ is an error rate of an index j in a channel index sequence $S_i$, $P_i(E_{worst})$ has a lowest error value for indexes belonging to an intersection of a set of indexes not included in the single polar code sequence and a set of a channel index sequence $A_i$ having a specific code rate, $\alpha_i$ is a parameter reflecting importance according to the code rate, and an operation of "$\{\cdot\}+$" is an operator which outputs a value in $\{\ \}$ as it is when the value in $\{\ \}$ is positive and outputs value in $\{\ \}$ as 0 when the value in $\{\ \}$ is negative.

10. The method of claim 6, wherein the penalty $W_j$ is calculated by $$(W_j=\max \{P_i(E_j)-P_i(E_{worst})\})$$

where $P_i(E_j)$ is an error rate of an index j in a channel index sequence $S_i$, and $P_i(E_{worst})$ has a lowest error value for indexes belonging to an intersection of a set of indexes not included in the single polar code sequence and a set of a channel index sequence $A_i$ having a specific code rate.

11. An apparatus for transmitting data using a polar code, the apparatus comprising:
   a polar coder configured to polar-code data to be transmitted using a single polar code sequence;
   a transceiver configured to transmit the polar-coded data;
   a memory configured to store at least single polar code sequence corresponding to a size of the data to be transmitted; and
   at least one processor configured to:
      determine the single polar code sequence based on the size of the data to be transmitted, a required code rate, and a target error rate;
      control the polar coder to polar-code the data to be transmitted with the determined single polar code sequence;
      calculate an error for each polarized sub-channel available in a communication system corresponding to each code rate;
      align each polarized sub-channel in order from a channel having a low error rate to a polarized sub-channel having a high error rate based on the error rate of the available polarized sub-channels for each code rate;
      generate channel index sequences assigning an index to the polarized sub-channels aligned for each code rate; and
      generate the single polar code sequence using the channel index sequence generated for each code rate,
   wherein the single polar code sequence is generated by:
      sequentially inserting a channel index sequence having a lowest code rate among the each code rates into the single polar code sequence,
      selecting a channel index sequence having the lowest code rate among the remaining code rates when a remaining region is present in the single polar code sequence, and
      sequentially aligning subsequent channel index sequences in the selected channel index sequence.

12. The apparatus of claim 11, wherein the single polar code sequence has different channel indexes based on a target error rate required for the same code rate.

13. The apparatus of claim 11, wherein the at least one processor is further configured to:
   calculate a penalty $W_j$ indicating a degradation in code performance of each code rate for each channel index sequence when a required number of code rates is larger than a predetermined number;
   realign the channel index sequence having the smallest penalty value for each channel index sequence; and
   generate the single polar code sequence using the realigned channel sequence, and
   wherein $W_j$ is calculated by $$W_j=\Sigma_i\alpha_i\{P_i(E_j)-P_i(E_{worst})\}^+$$

where $P_i(E_j)$ is an error rate of an index j in a channel index sequence $S_i$, $P_i(E_{worst})$ has a lowest error value for indexes belonging to an intersection of a set of indexes not included in the single polar code sequence and a set of a channel index sequence $A_i$ having a specific code rate, $\alpha_i$ is a parameter reflecting importance according to the code rate, and an operation of "$\{\cdot\}+$" is an operator which outputs a value in $\{\ \}$ as it is when the value in $\{\ \}$ is positive and outputs value in $\{\ \}$ as 0 when the value in $\{\ \}$ is negative.

14. The apparatus of claim 11, wherein the at least one processor is further configured to:
   calculate a penalty $W_j$ indicating a degradation in code performance of each code rate for each channel index sequence when a required number of code rates is larger than a predetermined number,
   realign the channel index sequence having the smallest penalty value for each channel index sequence; and
   generate the single polar code sequence using the realigned channel sequence, and
   wherein $W_j$ is calculated by $$(W_j=\max \{P_i(E_j)-P_i(E_{worst})\})$$

where $P_i(E_j)$ is an error rate of an index j in a channel index sequence $S_i$, and $P_i(E_{worst})$ has a lowest error value for indexes belonging to an intersection of a set of indexes not included in the single polar code sequence and a set of a channel index sequence $A_i$ having a specific code rate.

15. An apparatus for transmitting data using a polar code, the apparatus comprising:
   a polar coder configured to polar-code data to be transmitted using a single polar code sequence;
   a transceiver configured to transmit the polar-coded data;
   a memory configured to store at least a single polar code sequence corresponding to a size of the data to be transmitted; and
   at least one processor configured to:
      determine the single polar code sequence based on the size of the data to be transmitted, and a required code rate;
      control a target error rate and control the polar coder to polar-code the data to be transmitted with the determined single polar code sequence;
      calculate an error rate for each polarized sub-channel available in a communication system corresponding to each code rate;
      align each polarized sub-channel in order from a channel having a low error rate to a polarized sub-channel having a high error rate based on the error rate of the available polarized sub-channels for each code rate;
      calculate a penalty $W_j$ indicating a degradation in code performance from a channel index sequence having a lowest code rate among the respective channel index sequences by a predetermined scheme;
      realign the channel index sequences having the lowest code rate based on the penalty;
      insert the realigned channel index sequences into the single polar code sequence;
      select a channel index sequence having the lowest code rate among remaining code rates; and
      realign remaining channel indexes by calculating the penalty $W_j$ and then sequentially aligning the remaining realigned channel indexes in a region remaining in the single polar code sequence.

16. The apparatus of claim 15, wherein a channel index sequence having the lowest code rate among the remaining code rates is selected, and the remaining channel indexes in the selected channel sequence are realigned by calculating the penalty $W_j$ and then the sequential alignment of the remaining realigned channel indexes in the region remaining in the single polar code sequence is repeated until the single polar code sequence is completely filled.

17. The apparatus of claim 15, wherein the at least one processor is further configured to:
   extract indexes from the single polar code sequence in a descending order by a length of data when the data having a shorter length than that of the single polar code sequence is transmitted; and
   perform polar-coding the data to be transmitted from the polar coder using the sequence extracted from the single polar code sequence.

18. The apparatus of claim 15, wherein the penalty $W_j$ is calculated by $$W_j = \Sigma_i \alpha_i \{P_i(E_j) - P_i(E_{worst})\}^+$$

where $P_i(E_j)$ is an error rate of an index j in a channel index sequence $S_i$, $P_i(E_{worst})$ has a lowest error value for indexes belonging to an intersection of a set of indexes not included in the single polar code sequence and a set of a channel index sequence $A_i$ having a specific code rate, $\alpha_i$ is a parameter reflecting importance according to the code rate, and an operation of "$\{\cdot\}+$" is an operator which outputs a value in $\{\ \}$ as it is when the value in $\{\ \}$ is positive and outputs value in $\{\ \}$ as 0 when the value in $\{\ \}$ is negative.

19. The apparatus of claim 15, wherein the penalty $W_j$ is calculated by $$W_j = \max \{P_i(E_j) - P_i(E_{worst})\}$$

where $P_i(E_j)$ is an error rate of an index j in a channel index sequence $S_i$, and $P_i(E_{worst})$ has a lowest error value for indexes belonging to an intersection of a set of indexes not included in the single polar code sequence and a set of a channel index sequence $A_i$ having a specific code rate.

* * * * *